(12) United States Patent
van Hest et al.

(10) Patent No.: US 11,145,466 B2
(45) Date of Patent: Oct. 12, 2021

(54) PEROVSKITE-CONTAINING DEVICES AND METHODS OF MAKING THE SAME

(71) Applicants: Alliance for Sustainable Energy, LLC, Golden, CO (US); The Regents of the University of Colorado, Denver, CO (US)

(72) Inventors: Marinus Franciscus Antonius Maria van Hest, Lakewood, CO (US); Joseph Jonathan Berry, Boulder, CO (US); Sean Phillip Dunfield, Lafayette, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 16/297,539

(22) Filed: Mar. 8, 2019

(65) Prior Publication Data
US 2019/0279825 A1    Sep. 12, 2019

Related U.S. Application Data

(60) Provisional application No. 62/640,250, filed on Mar. 8, 2018.

(51) Int. Cl.
| | | |
|---|---|---|
| *H01G 9/00* | (2006.01) | |
| *H01G 9/20* | (2006.01) | |
| *H01L 51/00* | (2006.01) | |
| *H01L 51/42* | (2006.01) | |

(52) U.S. Cl.
CPC ......... *H01G 9/0036* (2013.01); *H01G 9/2009* (2013.01); *H01L 51/0024* (2013.01); *H01L 51/0077* (2013.01); *H01L 51/4293* (2013.01)

(58) Field of Classification Search
CPC .................................................. H01L 51/0021
See application file for complete search history.

(56) References Cited

U.S. PATENT DOCUMENTS

| 6,153,317 | A | 11/2000 | Boyle et al. | |
|---|---|---|---|---|
| 7,160,646 | B2* | 1/2007 | Ohshita ................ | H01M 4/364 429/218.1 |
| 8,405,233 | B2* | 3/2013 | Blizzard ............. | H01L 51/5253 257/788 |

(Continued)

FOREIGN PATENT DOCUMENTS

| EP | 3 244 455 A1 | 11/2017 |
|---|---|---|
| EP | 3 270 432 A1 | 1/2018 |

OTHER PUBLICATIONS

Kim et al., "Observation of Enhanced Hole Extraction in Br Concentration Gradient Perovskite Materials," 2016, Nano Letters 16, pp. 5756-5763. (Year: 2016).*

(Continued)

*Primary Examiner* — Robert A Vetere
(74) *Attorney, Agent, or Firm* — Neal Vickery; Michael A. McIntyre

(57) ABSTRACT

The present disclosure relates to a method that includes positioning a stack that includes at least one of the following layers between a first surface and a second surface: a first perovskite layer and/or a second perovskite layer; and treating the stack for a period of time by at least one of heating the stack or pressurizing the stack, where a device that includes the first surface and the second surface provides the heating and the pressurizing of the stack.

13 Claims, 25 Drawing Sheets

(56) References Cited

U.S. PATENT DOCUMENTS

| | | | | |
|---|---|---|---|---|
| 2001/0026444 | A1* | 10/2001 | Matsushima | H05K 1/162 361/763 |
| 2005/0183767 | A1* | 8/2005 | Yu | B82Y 30/00 136/263 |
| 2017/0287648 | A1 | 10/2017 | Wu et al. | |
| 2018/0248052 | A1* | 8/2018 | Seok | H01L 51/0003 |

OTHER PUBLICATIONS

Bag, S. et al., "Large Perovskite Grain Growth in Low-Temperature Solution-Processed Planar p-i-n Solar Cells by Sodium Addition," Applied Materials & Interfaces, vol. 8, 2016, pp. 5063-5057.

Bailey, B. et al., "Air-processed organic photovoltaic devices fabricated with hot press lamination," Elsevier Organic Electronics, vol. 12, 2011, pp. 108-112.

Bi, C. et al., "Efficient Flexible Solar Cell based on Composition-Tailored Hybrid Perovskite," Advanced Materials, vol. 29, 2017, 6 pages.

Burschka, J. et al., "Sequential deposition as a route to high-performance perovskite-sensitized solar cells," Nature, vol. 499, Jul. 18, 2013, pp. 316-320.

Christians, J. et al., "Tailored interfaces of unencapsulated perovskite solar cells for >1,000 hour operational stability," Nature Energy, vol. 3, Jan. 2018, pp. 68-74.

Dou, B. et al., "High-Performance Flexible Perovskite Solar Cells on Ultrathin Glass: Implications of the TCO," Journal of Physical Chemistry Letters, vol. 8, 2017, pp. 4960-4966.

Dualeh, A. et al., "Effect of Annealing Temperature on Film Morphology of Organic-Inorganic Hybrid Perovskite Solid-State Solar Cells," Advanced Functional Materials, vol. 24, 2014, pp. 3250-3258.

Heo, J. et al., "Ch3Nh3PbBr3-CH3NH3PbI3 Perovskite-Perovskite Tandem Solar Cells with Exceeding 2.2 V Open Circuit Voltage," Advanced Materials, vol. 28, 2016, pp. 5121-5125.

Hooper, K. et al., "Probing the degradation and homogeneity of embedded perovskite semiconducting layers in photovoltaic devices by Raman spectroscopy," Phys. Chem. Chem. Phys., vol. 19, 2017, pp. 5246-5253.

Jiang, F. et al., "Metal electrode-free perovskite solar cells with transfer-laminated conducting polymer electrode," Optics Express, vol. 23, No. 3, 2015, 9 pages.

Kaduwal, D. et al., "ITO-free laminated concept for flexible organic solar cells," Solar Energy Materials & Solar Cells, vol. 120, 2014, pp. 449-453.

Lee, T.W. et al., "High-Efficiency Soft-Contact-Laminated Polymer Light-Emitting Devices with Patterned Electrodes," Advanced Materials, vol. 16, No. 22, 2004, pp. 2040-2045.

Lee, D. et al., "Bioinspired Transparent Laminated Composite Film for Flexible Green Optoelectronics." Applied Materials & Interfaces, vol. 9, 2017, p. 24161-24168.

Li, T. et al., "Melt Processing of Hybrid Organic-Inorganic Lead Iodide Layered Perovskites," Chemistry of Materials, vol. 29, 2017, pp. 6200-6204.

Makha, M. et al., "A transparent, solvent-free laminated top electrode for perovskite solar cells," Science and Technology of Advanced Materials, vol. 17, No. 1, 2016, pp. 260-266.

Makuta, S. et al., "Photo-excitation intensity dependent electron and hole injections from lead iodide perovskite to nanocrystalline TiO2 and spiro-OMeTAD," Chem. Comm., vol. 52, 2016, pp. 673-676.

Nenon, D. et al., "Structural and chemical evolution of methylammonium lead halide perovskites during thermal processing from solution," Energy & Environmental Science, vol. 9, 2016, pp. 2072-2082.

Niu, G. et al., "Review of recent progress in chemical stability of perovskite solar cells," Journal of Materials Chemistry A, vol. 3, 2015, pp. 8970-8980.

Noel, N. et al., "A low viscosity, low boiling point, clean solvent system for the rapid crystallisation of highly specular perovskite films," Energy & Environmental Science, vol. 10, 2017, pp. 145-152.

Philippe, B. et al., "Chemical and Electronic Structure Characterization of Lead Halide Perovskites and Stability Behavior under Different Exposures—A Photoelectron Spectroscopy Investigation," Chemistry of Materials, vol. 27, 2015, pp. 1720-1731.

Rajamanickam, N. et al., "Stable and durable Ch3NH3PbI3 perovskite solar cells at ambient conditions," Nanotechnology, vol. 27, 2016, 12 pages.

Sadhanala, A. et al., Preparation of Single-Phase Films of CH3NH3Pb(l1-xBrx)3 with Sharp Optical Band Edges, Journal of Physical Chemistry Letters, vol. 5, 2014, pp. 2501-2505.

Saliba, M., "Cesium-containing triple cation perovskite solar cells: improved stability, reproducibility and high efficiency," Energy & Environmental Science, vol. 9, 2016, pp. 1989-1997.

Sanehira, E. et al., "Influence of Electrode Interfaces on the Stability of Perovskite Solar Cells: Reduced Degradation Using MoOx/Al for Hole Collection," ACS Energy Letters, vol. 1, 2016, pp. 38-45.

Shao, Y. et al., "Vacuum-free laminated top electrode with conductive tapes for scalable manufacturing of efficient perovskite solar cells," Science Direct, Nano Energy, vol. 16, 2015, pp. 47-53.

Song, T. et al., "Perovskite solar cells: film formation and properties," Journal of Materials Chemistry A, vol. 3, 2015, pp. 9032-9050.

Steirer, K. et al., "Defect Tolerance in Methylammonium Lead Triiodide Perovskite," ACS Energy Letters, vol. 1, 2016, pp. 360-366.

Tan, L. et al., "Self-encapsulated semi-transparent perovskite solar cells with water-soaked stability and metal-free electrode," Elsevier Organic Electronics, vol. 48, 2017, pp. 308-313.

Wang, Q. et al., "Effects of Self-Assembled Monolayer Modification of Nickel Oxide Nanoparticles Layer on the Performance and Application of Inverted Perovskite Solar Cells," ChemSusChem, vol. 10, 2017, pp. 3794-3803.

Weber, S. et al., "Investigation of NiOx-hole transport layers in triple cation perovskite," Journal of Materials Science Materials in Electronics, vol. 29, 2018, pp. 1847-1855.

Xing, G. et al., "Transcending the slow bimolecular recombination in lead-halide perovskites for electroluminescence," Nature Communications, 2017, 9 pages.

Yang, M. et al., "Square-Centimeter Solution-Processed Planar CH3NH3PbI3 Perovskite Solar Cells with Efficiency Exceeding 15%," Advanced Materials, vol. 27, 2015, pp. 6363-6370.

Yang, M. et al., "Facile fabrication of large-grain CH3NH3PbI3-xBrx films for high-efficiency solar cells via CH3NH3Br-selective Ostwald ripening," Nature Communications, 2016, pp. 1-9.

Yang, Y. et al., "Observation of a hot-phonon bottleneck in lead-iodide perovskites," Nature Photonics, vol. 10, 2016, pp. 53-59.

Yang, M. et al., "Perovskite ink with wide processing window for scalable high-efficiency solar cells," Nature Energy, vol. 2, 2017, pp. 1-9.

Zhang, F. et al., "Enhanced perovskite morphology and crystallinity for high performance perovskite solar cells using a porous hole transport layer from polystyrene nanospheres," Phys. Chem. Chem. Phys., vol. 18, 2016, p. 32903-32909.

Zhang, L. et al., "Interactions between molecules and perovskites in halide perovskite solar cells," Solar Energy Materials and Solar Cells, vol. 175, 2018, pp. 1-19.

Zhu, L. et al., "Performance enhancement of perovskite solar cells using a La-doped BaSnO3 electron transport layer," Journal of Materials Chemistry A, vol. 5, 2017, pp. 3675-3682.

Jiang, Q. et al., Enhanced electron extraction using SnO2 for high-efficiency planar-structure HC (NH2)2PbI3-based perovskite solar cells, Nature Energy, vol. 2, 2016, 7 pages.

You, J. et al., "Improved air stability of perovskite solar cells via solution-processed metal oxide transport layers," Nature Nanotechnology, vol. 11, 2016, 8 pages.

Search Report from corresponding PCT patent application No. PCT/US19/21496, dated Jul. 23, 2019, 4 pages.

(56) References Cited

OTHER PUBLICATIONS

Written Opinion from corresponding PCT patent application No. PCT/US19/21496, dated Jul. 23, 2019, 5 pages.

* cited by examiner

PEROVSKITE-CONTAINING DEVICES AND METHODS OF MAKING THE SAME

CROSS-REFERENCE TO RELATED APPLICATIONS

This application claims the benefit of U.S. Provisional Patent Application No. 62/640,250 filed Mar. 8, 2018, the contents of which are incorporated herein by reference in their entirety.

CONTRACTUAL ORIGIN

The United States Government has rights in this disclosure under Contract No. DE-AC36-08GO28308 between the United States Department of Energy and Alliance for Sustainable Energy, LLC, the Manager and Operator of the National Renewable Energy Laboratory.

BACKGROUND

Standard layer-by-layer solution processing methods constrain lead-halide perovskites device architectures, as the layer below the perovskite should be robust to the strong organic solvents used to form the perovskite, while the layer above may have a limited thermal budget before decomposition of the perovskite material occurs. In addition, when using standard solution processing method, these materials often need to be processed in non-polar solvents to prevent perovskite degradation. Thus, there remains a need for improved methods for manufacturing new and better-performing perovskite-containing layers and devices, in particular, devices having multiple perovskite active layers and multiple perovskite components.

SUMMARY

An aspect of the present disclosure is a method that includes depositing a first cation (A), a second cation (B), and an anion (X) onto at least one of a first surface or a second surface, resulting in at least one layer that includes at least one of A, B, or X and combining the first surface with the second surface such that the at least one layer is positioned between the first surface and the second surface. The method further includes, during at least a portion of the combining, applying at least one of heat or pressure to at least one of the first surface or the second surface resulting in at least one of the heating of the layer or the pressurizing of the layer, where during the combining, substantially all of A, B, and X remain between the first surface and the second surface, and the combining results in the transforming of the layer to a perovskite that includes $ABX_3$.

In some embodiments of the present disclosure, during the combining, the heating of the layer may be to a temperature between 0° C. and 500° C. In some embodiments of the present disclosure, during the combining, the pressurizing of the layer may be to a pressure between one atmosphere and 100 atmospheres. In some embodiments of the present disclosure, the combining may be performed for a period of time between five seconds and 24 hours. In some embodiments of the present disclosure, the perovskite may include at least one of $MAPbI_3$, $MAPbBr_3$, $CsPbI_3$, $CsPbBr_3$, $Cs_{0.05}(MA_{0.17}FA_{0.83})_{0.95}Pb(I_{0.83}Br_{0.17})_3$, and/or $MAPb(I_xBr_{1-x})_3$, where $0 \le x \le 1$. In some embodiments of the present disclosure, the method may further include a device that includes the first surface and the second surface, and where the device that applies the heat or the pressure. In some embodiments of the present disclosure, the device may be a press.

An aspect of the present disclosure is a method that includes a first depositing of at least one of a first cation (A), a second cation (B), or a first anion (X) onto a first surface, resulting in the forming of a first layer that includes at least one of A, B, or X and a second depositing of at least one of a third cation (A'), a fourth cation (B'), and a second anion (X') onto a second surface, resulting in the forming of a second layer that includes at least one of A', B', or X'. The method further includes combining the first surface with the second surface such that the first layer and the second layer are in physical contact with each other and the first layer and the second layer are positioned between the first surface and the second surface, where during at least a portion of the combining, applying at least one of heat or pressure to at least one of the first surface or the second surface resulting in at least one of the heating of the first layer and second layer or the pressurizing of the first layer and the second layer. Furthermore, during the combining, substantially all of A, B, and X remain between the first surface and the second surface, substantially all of A', B', and X' remain between the first surface and the second surface, the combining results in the transforming of the first layer and the second layer to a layer of a perovskite comprising $A_{1-x}A'_xB_{1-y}B'_y(X_{1-z}X'_z)_3$, and $0 \le x \le 1$, $0 \le y \le 1$, and $0 \le z \le 1$.

In some embodiments of the present disclosure, the perovskite layer may have a concentration gradient across the thickness of layer of at least one of A, B, X, A', B', and/or X'. In some embodiments of the present disclosure, the method may further include a device that includes the first surface and the second surface, and the device applies the heat or the pressure. In some embodiments of the present disclosure, the device may be a press.

An aspect of the present disclosure is a method that includes positioning a stack that includes at least one of the following layers between a first surface and a second surface: a first perovskite layer and/or a second perovskite layer; and treating the stack for a period of time by at least one of heating the stack or pressurizing the stack, where a device that includes the first surface and the second surface provides the heating and the pressurizing of the stack, and the treating converts the first perovskite layer and the second perovskite layer to a third perovskite layer having at least one physical property or performance metric that is different than physical properties or performance metrics of the first perovskite layer and the second perovskite layer.

An aspect of the present disclosure is a device that includes a perovskite layer having a thickness and including $A_{1-x}A'_xB_{1-y}B'_y(X_{1-z}X'_z)_3$, where A includes a first cation, B includes a second cation, X includes a first anion, A' includes a third cation, B' includes a fourth cation, and X' comprises a second anion, and the perovskite layer has a concentration gradient across its thickness of at least one of A, B, X, A', B', or X'.

In some embodiments of the present disclosure, the concentration gradient may be measurable by time-of-flight secondary ion mass spectrometry. In some embodiments of the present disclosure, the perovskite layer may include at least one of $MAPbI_3$, $MAPbBr_3$, $CsPbI_3$, $CsPbBr_3$, $Cs_{0.05}(MA_{0.17}FA_{0.83})_{0.95}Pb(I_{0.83}Br_{0.17})_3$, and/or $MAPb(I_xBr_{1-x})_3$, where $0 \le x \le 1$.

BRIEF DESCRIPTION OF THE DRAWINGS

Exemplary embodiments are illustrated in referenced figures of the drawings. It is intended that the embodiments and figures disclosed herein are to be considered illustrative rather than limiting.

REFERENCE NUMBERS

Figure 1:
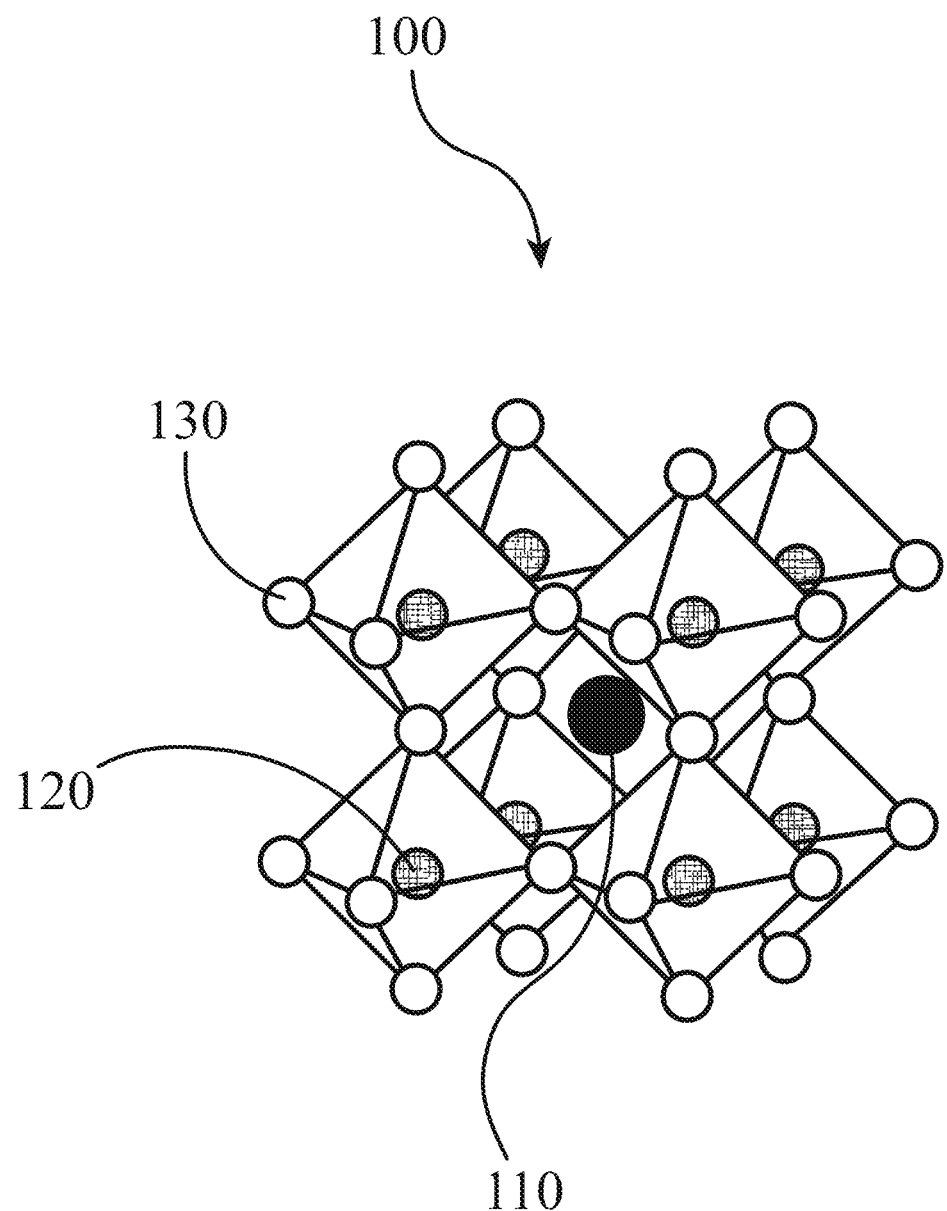
FIG. 1 illustrates a perovskite, according to some embodiments of the present disclosure.

| | |
|---|---|
| 100 | perovskite |
| 110 | A-cation |
| 120 | B-cation |
| 130 | X-anion |
| 200 | method |
| 210 | first fabricating |
| 215 | first partial stack |
| 220 | second fabricating |
| 225 | second partial stack |
| 230 | combining |
| 290 | full stack |
| 300 | pressure and/or heating device |
| 310 | first surface |
| 320 | second surface |
| 330 | seal |
| 400 | perovskite layer |
| 410 | charge transport layer |
| 420 | current collecting layer |
| 430 | substrate |

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to perovskite-containing photovoltaic devices and methods for creating such devices by producing at least two portions of a device, referred to herein as "partial stacks", and then physically joining the two or more partial stacks (e.g. by physically combining the partial stacks using temperature, pressure, and time) to produce the final device, referred to herein as a "full stack". In some embodiments of the present disclosure, the full stack may be encapsulated; e.g. isolated from the external environment such as from atmospheric moisture and/or air. The methods disclosed herein may enable the fabrication of at least two new types of full stack perovskite-containing photovoltaic devices: (1) devices utilizing a heterojunction, and (2) devices less sensitive to typical thermal budgeting and solvent compatibility constraints (e.g. a device with its n-type electron transportation layer from the n-i-p architecture and p type hole transportation layer from the p-i-n architecture, as shown here). As used herein, the term "thermal budget" refers to a device's thermal history; e.g. temperatures and times at these temperatures. Although the examples provided herein relate to photovoltaic devices, the manufacture of other perovskite-containing devices, using the methods described herein, fall within the scope of the present disclosure: e.g. light-emitting diodes, sensors, and/or lasers.

These advances may allow for (A) a gradient to be built into a perovskite active layer to improve device performance and/or stability, and (B) the use of alternative materials for contacts (e.g. materials that are deposited at temperatures too high to be deposited using incumbent methods and device architectures), which may, for example, be needed to stabilize the device structure. As used herein, the term "gradient" refers to the change in the value of a parameter as a result of a change in distance; e.g. position in the thickness direction of a perovskite film. For example, the methods described herein may enable the formation of at least one of a compositional gradient and/or charge gradient relative to the thickness direction of a perovskite layer. In some embodiments of the present disclosure, a charge gradient may result in the formation of an electric field within the perovskite layer.

Moreover, the methods described herein may allow both the surface of at least one of a charge transport layer (e.g. an electron transport layer (ETL) and/or a hole transport layer (HTL)) to be manipulated and/or the surface of an adjacent perovskite active layer to be manipulated independently of one another; e.g. addition of surface functional groups such as hydroxyl groups. This independent manipulation of two or more surfaces may in turn result in the formation of more optimal interface layers created by the contacting of the two or more surfaces with one another. In some embodiments of the present disclosure, the methods described herein may result in the encapsulation of the resultant perovskite devices, and achieve at least one of the improvement of the resultant electronic structure, a reduction in the number of defects in the resultant perovskite and/or at the interface(s), an increase in the resultant perovskite crystallinity, and/or an enhancement in at least one of the photophysical properties (for example, excited state carrier lifetime, surface recombination velocity, diffusion coefficient, etc.) of the resultant combined perovskite layer of the full stack. Thus, as described herein, a first partial stack may be physically combined with at least one additional partial stack to form a full stack perovskite-containing device, for example a photovoltaic device, although other perovskite-containing devices fall within the scope of the present disclosure; e.g. LEDs, transistors, sensors, etc.

FIG. 1 illustrates that a perovskite 100 may organize into cubic crystalline structures, as well as other crystalline structures such as tetragonal and orthorhombic, and may be described by the general formula $ABX_3$, where X (130) is an anion and A (110) and B (120) are cations, typically of different sizes (A typically larger than B). Referring to the generic structure described above, in a more complicated multi-component perovskite example, $A'_2A_{n-1}Pb_nBr_{3n-1}X'_2$, lead is an example of a B-cation (120) and bromine is an example of an anion X (130). Other examples of B-cations, including monovalent and multivalent B-cations, also within the scope of the present disclosure, include at least one of tin, germanium, silver, bismuth, titanium, indium, gallium, copper, silver, gold, rhodium, and/or antimony. Thus, the generic structure may also be represented by $A'_2A_{n-1}B_nX_{3n-1}X'_2$, where A' and A are different or the same A-cations (110), B is a B-cation (120), X and X' are the same or different X-anions (130), and n is number of $BX_2$ layers within the structure between A'X' layers. In a cubic unit cell, the B-cation 120 resides at the eight corners of a cube, while the A-cation 110 is located at the center of the cube, with twelve X-anions 130 centrally located between B-cations 120 along each edge of the unit cell. Typical inorganic perovskites include calcium titanium oxide (calcium titanate) and strontium titanate and/or other similar minerals. In some embodiments of the present disclosure, the A-cation 110 may include a nitrogen-containing organic compound such as an alkyl ammonium compound. The B-cation 120 may include a metal and the X-anion 130 may include a halogen.

Additional examples for the A-cation 110 include organic cations and/or inorganic cations. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include cesium, methylammonium ($CH_3NH^{3+}$) (MA), ethylammonium ($CH_3CH_2NH^{3+}$), propylammonium ($CH_3CH_2CH_2NH^{3+}$), butylammonium ($CH_3CH_2CH_2CH_2NH^{3+}$), formamidinium ($NH_2CH=NH_2^+$) (FA), guanidinium (GA), dimethylammonium (DMA), acetamidinium (AC) and/or any other suitable nitrogen or carbon-containing organic compound. In other examples, an A-cation 110 may include an alkylamine. Thus, an A-cation 110 may include an organic component with one or more protonated amine groups. For example, an A-cation 110 may be an alkyl diamine such as formamidinium. Thus, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), 1-methyl-1-ethyl ($C_3$), n-butyl ($C_4$), 1-methyl-1-propyl ($C_4$), 2-methyl-1-propyl ($C_4$), 1,1-dimethyl-1-ethyl ($C_4$), n-pentyl ($C_5$), 1-methyl-1-butyl ($C_5$), 1-ethyl-1-propyl ($C_5$), 2-methyl-1-butyl ($C_5$), 3-methyl-1-butyl ($C_5$), 1,1-dimethyl-1-propyl ($C_5$), 2,2-dimethyl-1-propyl ($C_5$), and n-hexyl ($C_6$). Additional examples of alkyl groups include n-heptyl ($C_7$), n-octyl ($C_8$) and the like. In some embodiments, the organic constituent may be an alkyl group such as a straight-chain or branched unsaturated group having from 1 to 20 carbon atoms. Examples of unsaturated alkyl groups include ethenyl ($C_2$), 1-propenyl ($C_3$), 2-propenyl ($C_3$), 1-butenyl ($C_4$), 2-butenyl ($C_4$), 3-butenyl ($C_4$), 2-methyl-1-propenyl ($C_4$), 2-methyl-2-propenyl ($C_4$), 1-pentenyl ($C_5$), 2-pentenyl ($C_5$), 3-pentenyl ($C_5$), 4-pentenyl ($C_5$), 1-methyl-1-butenyl ($C_5$), 2-methyl-1-butenyl ($C_5$), 3-methyl-1-butenyl ($C_5$), 1,2-dimethyl-1-propenyl ($C_5$), 1,2-dimethyl-2-propenyl ($C_5$), and 1-hexenyl ($C_6$). Additional examples of alkyl groups include 1-heptenyl ($C_7$), 1-octenyl ($C_8$) and the like. In addition, the A-cation 110 may include an unsaturated species with a nitrogen constituent. In some cases, the nitrogen-containing organic group may be an aryl group having from 3 to 20 carbon atoms. Examples of aryl groups include pyridine ($C_5H_5N$), pyridazine (1,2-$C_4H_4N_2$), pyrimidine (1,3-$C_4H_4N_2$), pyrazine (1,4-$C_4H_4N_2$), triazine (1,2,3-1,2-$C_3H_3N_3$; 1,2,4-1,2-$C_3H_3N_3$; 1,3,5-1,2-$C_3H_3N_3$), bipyridine (2,2'-$C_{10}H_8N_2$; 2,3'-$C_{10}H_8N_2$; 2,4'-$C_{10}H_8N_2$; 3,3'-$C_{10}H_8N_2$; 3,4'-$C_{10}H_8N_2$; and 4,4'-$C_{10}H_8N_2$), phenanthroline (1,10-$C_{12}H_8N_2$ and other isomers), terpyridine (2,2';6',2''-$C_{15}H_{11}N_3$ and other isomers) and the like. In the cases where more than one nitrogen is present, the A-cation may be multivalent, i.e., di-cation, tri-cation, etc. by pronating the amine groups to form ammoniums. In addition, instead of protonation, covalent bonds can be formed to one or more amine nitrogen atoms to give ammoniums. For example, 4,4'-bipyridine can be doubly methylated to form N,N'-dimethyl-4,4'-bipyridinium $[(C_5H_4NCH_3)_2]^{2+}$, the dichloride salt of which is commonly known as paraquat. In these cases of multivalent cations, the stoichiometry of the $A'_2A_{n-1}Pb_nBr_{3n-1}X'_2$ structure changes since fewer A-cations are required for charge balance. In the di-cation paraquat example, only one A-cation is required to charge-balance two perovskite layers, generating a structure $A''A_{n-1}Pb_nBr_{3n-1}X'_2$ where $A''=[(C_5H_4NCH_3)_2]^{2+}$.

Examples of metal B-cations 120 include, for example, lead, tin, germanium, and/or any other 2+ valence state metal that can charge-balance the perovskite 100. Examples for X-anions 130 include halogens: e.g. fluorine, chlorine, bromine, and/or iodine. In some cases, the perovskite 100 may include more than one type of X-anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cations 120, and X-anion 130 may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite 100 may have more than one halogen element, where the various halogen elements are present in non-integer quantities; e.g. x is not equal to 1, 2, or 3. In addition, perovskite crystals may form three-dimensional (3-D), two-dimensional (2-D), one-dimensional (1-D) or zero-dimensional (0-D) networks, possessing the same unit structure.

Standard sequential-deposition solution processing methods may constrain perovskite device architectures, as the layer below the perovskite should be robust to the strong organic solvents often used to form the perovskite, while the layer(s) above may have a limited thermal budget (e.g. temperature and time at temperature) and/or may need to be processed in non-polar solvents to prevent perovskite degradation. To circumvent these limitations, among other things, methods are described herein where at least two transparent conductive oxide/transport material/perovskite devices, partial stacks, are independently fabricated and then physically combined together at the perovskite-perovskite interface to form a final full stack perovskite-containing device. As validated by UV-Visible absorption spectroscopy, external quantum efficiency, x-ray diffraction, and time-resolved photoluminescence spectroscopy, the methods described herein improve the physical properties and/or the performance metrics of the resultant full stack perovskite-containing devices. In some embodiments of the present disclosure, using the method described herein, semi-transparent full stack perovskite-containing PV devices were fabricated that contained two oxide current collecting layers deposited at relatively high temperature, with the final full stack device having an average PCE of 9.6% (maximum 10.6%).

As described herein, some embodiments of the present disclosure may include full stack perovskite-containing PV devices that include one or more oxide layers, e.g. transparent oxide charge transport and/or current collecting layers, deposited by methods that do not impact the structure and/or performance characteristics of the underlying layers onto which the oxide layer(s) is deposited. Since the methods described herein do not deposit oxide layer(s) onto a perovskite layer, oxide deposition methods utilizing deposition temperatures in excess of 100° C., up to as high as 750° C., may be used. In addition, oxide deposition methods utilizing essentially any solvent may be utilized, including polar and/or non-polar solvent, with examples including dimethylformamide (DMF) and/or dimethyl sulfoxide (DMSO). In general, the methods described herein enable the depositing of non-perovskite layers (e.g. substrates, charge transport layers, and/or current collecting layers) that sometimes require a large thermal budget, which, when using incumbent and/or alternative methods, would negatively impact the other layers in the partial stack and/or full stack (e.g. perovskite layers). For example, the methods described herein enable the production of bifacial devices have two transparent current collecting layers and/or two transparent charge transport layers instead of just one, where a perovskite active layer is positioned between the two transparent current collecting layers and/or two transparent charge transport layers.

In some embodiments of the present disclosure, a nickel oxide ($NiO_x$) HTL may be deposited directly onto a transparent current collecting oxide layer (indium tin oxide, ITO) and/or directly onto any other current collecting layer (e.g. transparent or otherwise) and/or any other suitable substrate of a partial stack, followed subsequently by the depositing of a perovskite layer onto the nickel oxide HTL of the partial stack. For exemplary purposes, a nickel oxide HTL transport layer may be deposited as follows. First, nickel nitrate hexahydrate ($Ni(NO_3)_2 \cdot 6H_2O$) may be dissolved in ethylene glycol to form a 1 M solution. This solution may then be cooled, for example by being placed in a freezer. At some time period before deposition (e.g. between 1 minute and 2 hours), a green-colored solution resulting from the cooling of nickel nitrate hexahydrate/ethylene glycol solution, may have ethylenediamine (e.g. at 1 M concentration) added. The resultant solution may then be agitated, causing the solution to turn dark blue. The solution may then be mixed further, for example by sonicating for a period of time (e.g. greater than zero minutes to 30 minutes). Other methods of mixing may be used. The mixed solution may then be filtered (e.g. using a 0.2 um PTFE filter), and deposited by any reasonable solution processing method, for example by spin-casting (e.g. between 1000 rpm and 10,000 rpm) for between one second and 15 minutes, using a suitable ramp time (e.g. between 0.1 seconds and 10 seconds). Other depositing methods may include curtain coating, slot-die coating, dip-coating, and/or spraying, etc. The resulting liquid film may then be temperature and/or vacuum treated to convert the liquid film to the desired solid nickel oxide charge transport layer. For example, the liquid film may be heat-treated at a temperature between 100° C. and 300° C., for a time period between one minute and 5 hours. In some embodiments of the present disclosure, the depositing of a nickel oxide layer may be performed in air and/or in an inert environment (e.g. in argon, nitrogen, helium, etc.). The final solid nickel oxide solid layer may be subsequently cleaned using any suitable method, for example, UV-ozone treating for a period of time between 30 seconds and one hour.

In some embodiments of the present disclosure, a tin oxide ($SnO_x$) electron transport layer (ETL) may be deposited onto a current collecting layer (e.g. ITO, FTO, metallic contact or foil) or directly onto any other suitable a current collecting layer (e.g. transparent or otherwise) and/or any other suitable substrate of a partial stack, followed subsequently by the depositing of a perovskite layer onto the partial stack. For exemplary purposes, a tin oxide ETL may be deposited as follows. $SnO_2$ (about 15% in $H_2O$ colloidal dispersion) may be diluted using deionized water to a concentration between 1% and less than 15% and then mixed and/or cooled. Mixing may be achieved by sonicating for a time period between one minute and one hour, with the solution maintained at a temperature between 0° C. and 20°. Other methods of mixing may be used. The mixed solution may then be deposited by any reasonable solution processing method, for example by spin-casting (e.g. between 1000 rpm and 10,000 rpm) for between about 10 seconds and about ten minutes, using a suitable ramp time (e.g. between 0.1 seconds and 10 seconds). The solution may be filtered prior to the depositing, using any suitable filtration medium. Other depositing methods may include curtain coating, slot-die coating, dip-coating, and/or spraying, etc. The resulting liquid film may then be temperature and/or vacuum treated to convert the liquid film to the desired solid nickel oxide charge transport layer. For example, the liquid film may be heat-treated at a temperature between 100° C. and 300° C., for a time period between one minute and 5 hours. In some embodiments of the present disclosure, the depositing of a tin oxide layer may be performed in air and/or in an inert environment (e.g. in argon, nitrogen, helium, etc.). The final solid tin oxide solid layer may be subsequently cleaned using any suitable method, for example, UV-ozone treating for a period of time between 30 seconds and one hour.

Figure 2:
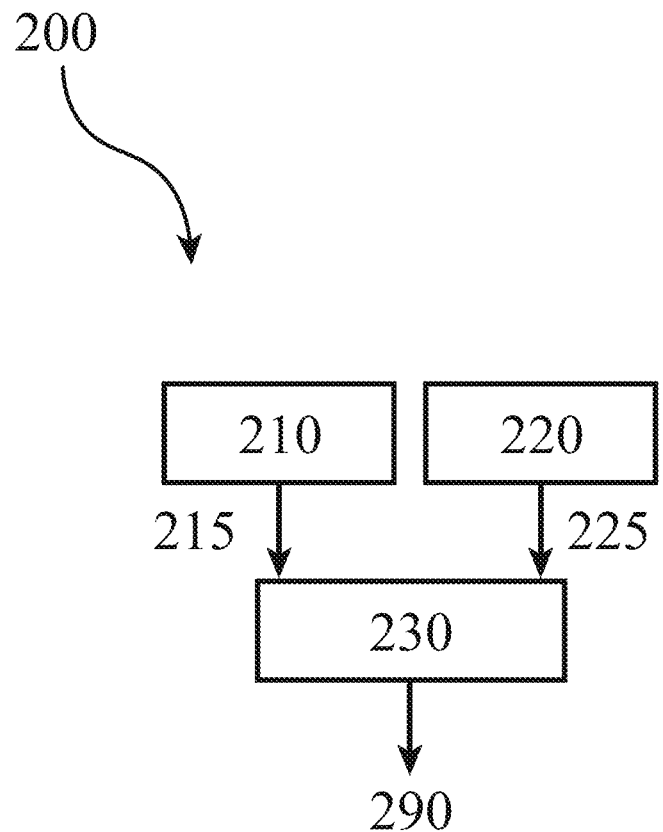
FIG. 2 illustrates a method for making a perovskite-containing device, according to some embodiments of the present disclosure.

FIG. 2 illustrates a method 200 for producing a full stack perovskite-containing device 290, according to some embodiments of the present disclosure. The method 200 may include a first fabricating 210 of a first partial stack 215 and a second fabricating 220 of a second partial stack 225, where at least one of the first partial stack 215 and/or the second partial stack 225 contain a perovskite, for example, in the form of a perovskite layer. Subsequently, the final targeted full stack perovskite-containing device 290 may be produced by a combining 230 of at least the first partial stack 215 and the second partial stack 225. The first fabricating 210 and/or the second fabricating 220, two produce at least one perovskite, may be accomplished by solution processing and/or vapor-phase processing methods, as described herein. The combining 230 may include physically contacting at least one surface of the first partial stack 215 with at least one surface of the second partial stack 225 with the application of pressure and/or temperature for a period of time. In some embodiments of the present disclosure, the pressure used in the combining 230 may be between 0 psig and 1000 psig and/or between 200 psig and 500 psig. (One atmosphere is equal to 14.7 psi.) In some embodiments of the present disclosure, the temperature used in the combining 230 may be between 0° C. and 500° C. The specific temperature range, pressure range, and/or combining time used for the combining 230 may depend on the composition of the perovskite layer(s) used, for example, the type and/or number of types of A-cations included. For example, a methylammonium/formamidinium (MA/FA) composition may be combined using a temperature between greater than 100° C. and about 150° C. A composition including cesium and MA/FA may be combined using a temperature between greater than 100° C. and about 170° C. A composition including only cesium may be combined using a temperature between greater than 100° C. and about 350° C. In some embodiments of the present disclosure, the period of time used in the combining 230 may be between 5 seconds and several days, or between 20 minutes and one hour.

In some embodiments of the present disclosure, the combining 230 may be performed such that none of the components contained in the combining 230 can be removed from the forming full stack and/or the fully formed full stack during and/or after the combining, regardless of the temperature and/or pressure conditions used during the combining 230. Thus, from a mass balance perspective, in some embodiments of the present disclosure, substantially all of the mass contained in the partial stacks remain in the full stack, both during and after its forming. Thus, substantially none of the elements, and/or chemical species included in the partial stacks are removed from the partial stacks and/or full stack during and/or after the combining step, either as a solid, liquid, and/or gas. Maintaining the mass balance may prevent the formation of degradation products according to Equation (1), for example, and lead to a substantially complete conversion of the starting precursors to the targeted perovskite. This may be achieved by using a forming device (e.g. a press) that provides a gas and liquid-tight seal around the outer perimeter of the partial stacks and the resultant full stack. In some embodiments of the present disclosure, the full stack 290 resulting from the combining 290 may be cooled in a cooling step (not shown). Cooling rates may be tuned to a specific desired rate by selection of the heat-transfer medium chosen (e.g. liquid and/or gas) and its supply temperature. For example, rapid cooling may be achieved by submerging, dipping, and/or passing the full stack 290 into and/or through water at a temperature that is less than the temperature used for the combining 230 and/or fabricating (210 and/or 220). In some embodiments of the present disclosure, the full stack 290 may be cooled while it is still in the forming device. Cooling may also be achieved using a gas heat-transfer medium such as cooled air or an inert gas such as nitrogen.

As disclosed herein, the actual examples of full stacks manufactured and reported herein used a Carver press. However, in general, any mechanical system capable of supplying temperature and pressure for the desired amount of time, that can also keep the layers being heated and pressed sealed from the environment falls within the scope of the present disclosure. Exemplary devices include two opposing plates, where at least one of the plates is heated (e.g. electrically, inductively, heat transfer fluid, etc.). Opposing plates may be oriented with their surfaces parallel to one another and then pressed together. Opposing plates may be connected at a hinge and close together in a clam-shell fashion. Opposing plates may also contain a well and/or impression shaped to the size of the targeted full stack devices dimensions; e.g. thickness, width, and length. A sealing mechanism may also be provided around the perimeter of the well, such as a gasket, to maintain an airtight seal during the combining. In some embodiments of the present disclosure, where the perovskite layer(s) are positioned between layers of the stack that are gas tight and temperature resistant to form the stack in the form of a sheet, the combining may be achieved by directing the sheet between two heated rollers. In some embodiments, such a sheet may first be compressed between two rigid plates and/or flexible sheets (e.g. metallic) followed by, with the full stack while still positioned between the rigid plates and/or flexible sheets, directing the full stack a heating oven and/or heating bath to complete the combining. Pressure may be applied mechanically, pneumatically, or by any other suitable means. In some embodiments of the present disclosure, the partial stacks and the resultant full stack may be "laminated" together in a roll-to-roll process, especially when they are in the form of sheets and/or a continuous web.

Referring again to FIG. 2, in some embodiments of the present disclosure, at least one of the first fabricating 210 and/or second fabricating 220 may involve the forming of a perovskite (e.g. a layer) by any suitable depositing method (e.g. liquid phase and/or vapor phase deposition methods). However, other possibilities include fabricating steps (210 and/or 220) where the perovskite precursors are provided, specifically at least one of an A-cation, a B-cation, and/or an X-anion. Thus, some embodiments of the present disclosure include a method 200 for making a perovskite-containing full stack 290, where at least one fabricating step (210 and/or 220) includes providing at least one perovskite precursor to a substrate or surface resulting in a partial stack (215 and/or 225) containing the at least one perovskite precursor, such that the subsequent combining 230 produces the perovskite-containing full stack 290. Thus, a fabricating (210 and/or 220) step may include the depositing of any of the first partial stack's elements (e.g. substrate, charge transport layer, current collecting layer, etc.), including a fully formed perovskite layer, and/or the precursors needed to make a targeted perovskite layer during the combining 230 step, where the depositing of at least one of the partial stack's elements is onto at least one of the heating/pressure-producing surfaces of the device used to complete the combining 230.

For example, a first fabricating 210 may produce a first partial stack 215 that includes methylammonium and iodine and a second fabricating 220 may produce a second partial stack 225 that includes lead and iodine. Subsequently, the combining of the first partial stack 215 having methylammonium and iodine with the second partial stack 225 having lead and iodine may result in a full stack 290 having a perovskite layer of MAPI. For this example, the methylammonium and iodine contained in the first partial stack 215 may be supplied in the first fabricating 210 as MAI, and the lead and iodine contained in the second partial stack 225 may be supplied as $PbI_2$. The perovskite precursors may be deposited onto their respective partial stacks (215 and/or 225) either in solid and/or liquid form. For this MAPI example, the $PbI_2$ may be provided in the form of a solid (e.g. a powder or film) and/or dissolved in a solvent. Further, if the $PbI_2$ is provided in solution form to a substrate (e.g. support substrate, charge transport layer, current collecting layer, etc.), the solvent may be subsequently removed to form a crystalline layer of the $PbI_2$ on the substrate. Thus, according to some embodiments of the present disclosure, perovskite-containing full stacks 290 may be formed by the combining, using at least one of temperature and/or pressure for a period time, of two or more partial stacks (215 and/or 225) that include at least one of a perovskite and/or a perovskite precursor in at least one of a solid form and/or a liquid form. For the example where perovskite precursors are deposited onto a surface during the fabricating (210 and/or 220), examples of perovskite precursors that may be utilized include MA, FA, GA, AC, Cs, I, Br, Cl, AI, MABr, MACl, FAI, FABr, FACl, GuaI, GuaBr, GuaCl, CsI, CsBr, CsCl, PbI2, SnI2, BiI3, and/or any other combination derived from the lists of A-cations, B-cations, and X-anions provided herein.

Thus, in some embodiments of the present disclosure, at least one first heat resistant (e.g. maintains structural integrity up to 750° C.) and gas impermeable layer (e.g. a substrate, charge transport layer, and/or current collecting layer) may be deposited onto a first surface of a combining device (e.g. a press) to form a first partial stack on the first surface. Similarly, at least one second heat resistant (e.g. maintains structural integrity up to 750° C.) and gas impermeable layer (e.g. a substrate, charge transport layer, and/or current collecting layer) may be deposited onto a second surface of the combining device (e.g. a press) to form a second partial stack. Subsequently, at least one perovskite precursor layer and/or perovskite layer, in at least one of a solid and/or liquid form, may be deposited onto at least one of the heat resistant and gas impermeable layers to create at least one partial stack including at least one of a perovskite precursor layer and/or perovskite layer. Subsequently, the two partial stacks may be combined by contacting the opposing outside surfaces of the at least one perovskite precursor layer and/or perovskite layer, achieved by pressing the first and second surfaces of the device (e.g. press) together and/or heating the surfaces of the device for a set period of time, as described above.

Figure 3:
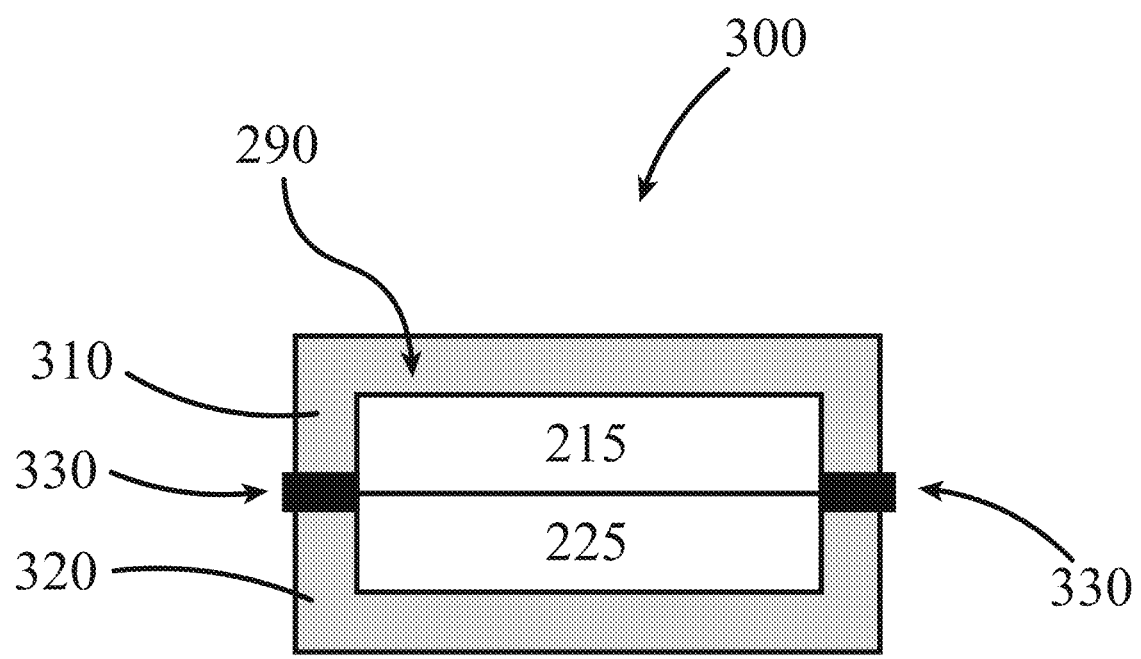
FIG. 3 illustrates a perovskite-containing device, according to some embodiments of the present disclosure.

FIG. 3 illustrates an example of a full stack perovskite-containing device 290 that may be produced by a method similar to method 200 of FIG. 2, according to some embodiments of the present disclosure. In this example, the full-stack perovskite-containing device 290 includes a first partial stack 215 and a second partial stack 225 that have been physically combined using at least one of pressure and/or heat for a period of time. This pressure and/or heat may be provided by positioning the first partial stack 215 and the second partial stack 225 in a pressure and/or heating device 300 (e.g. a press) having at least a first surface 310 and a second surface 320. As shown in FIG. 3, at least one of the first surface 310 and/or the second surface 320 may be constructed to have a first wall parallel to the width and length of the partial stacks (215 and/or 225) and two walls perpendicular to the first wall, such that the first wall and its perpendicular walls form a depression into which at least one of the partial stacks (215 and/or 225) or elements of the partial stacks or precursors of the partial stacks may be deposited. Thus, in some embodiments of the present disclosure, a first partial stack 215 or elements thereof may be positioned and/or deposited against and/or in the depression of a first surface 310 of the pressure and/or heating device 300, and a second partial stack 215 or elements thereof may be positioned and/or deposited against and/or in the depression of a second surface 320 of the pressure and/or heating device 300. Once the two partial stacks (215 and 225) are positioned in their respective halves of the pressure and/or heating device 300, the first surface 310 and the second surface 320 may be moved together bringing the partial stacks (215 and 225) in contact with each other, as shown in FIG. 3. A gas-tight seal 330 may be provided between the edges of the first surface 310 and/or second surface 320, e.g. around the perimeter of walls forming the depression. The sandwiching of the partial stacks (215 and 225) between the two surfaces (310 and 320) may provide the pressure to the partial stacks (215 and 225), physically bringing them together and joining them. Heat may then be provided to the partial stacks (215 and 225) using, for example, resistive heaters, inductive heaters, and/or a heat transfer fluid built into the walls of a least one of the two surfaces (310 and/or 320).

The first partial stack 215 may include at least one of a perovskite precursor, a perovskite-containing active layer, a charge transport layer, a charge collecting layer, a substrate layer, an antireflective layer, a release layer, and/or any other layer suitable for a particular device or application. Similarly, the second partial stack 225 may include at least one of a perovskite precursor, a perovskite-containing active layer, a charge transport layer, a charge collecting layer, a substrate layer, an antireflective layer, a release layer, and/or any other layer suitable for a particular device or application.

Any perovskite composition and/or perovskite precursor formulation may be utilized in at least one partial stack and/or full stack as described above. For example, any perovskite formulation having an A-cation comprising at least one of MA, ethylammonium, propylammonium, butylammonium, FA, AC, guanidinium (GA), dimethylammonium, rubidium, cesium, and/or any other suitable element may be utilized in the methods and/or devices described herein. Some examples of hole transport layers (HTLs) that may be utilized in some embodiments of the present disclosure include at least one nickel oxide, copper chromium iodide, and/or copper iodide. Some examples of electron transport layers (ETLs) that may be utilized in some embodiments of the present disclosure include at least one $WoO_x$, $SnO_x$, $TiO_2$, and/or $VO_x$. Some examples of current collecting layers that may be utilized in some embodiments of the present disclosure include at least one fluorine-doped tin oxide (FTO), indium-doped tin oxide (ITO), indium-doped zinc oxide (IZO), aluminum-doped zinc oxide (AZO), silver, gold, and/or aluminum. Any of these charge transport layers may be used as a heat resistant and gas impermeable layer during the heat and pressure treating of the combining of the partial stacks to make a full stack.

In some embodiments of the present disclosure, the methods described herein enable the producing of various unique full stack, perovskite-containing devices. Such device, for example, may include, in order, a first conductive layer, a metal oxide HTL, a perovskite layer, a metal oxide ETL, and second conductive layer. Another example is a full stack that includes a first condfuctive layer, a sputtered HTL, a perovskite layer, a sputtered ETL, and a second conductive layer. Another example is a full stack that includes a first conductive layer, an atomic layer deposition (ALD) deposited HTL, a perovskite layer, an ALD deposited ETL, and a second conductive layer. In some embodiments of the present disclosure, at least one first conductive layer may be interdigitated with a second conductive layer.

In some embodiments of the present disclosure, the combining 230 may include a first partial stack 215 that includes a first perovskite composition ($ABX_3$) and/or a first perovskite precursor formulation, and a second partial stack 225 that includes a second perovskite composition ($A'B'X'_3$) and/or second perovskite precursor formulation, where the first perovskite composition and/or first perovskite precursor formulation may be either the same as or different than the second perovskite composition and/or second perovskite precursor formulation. In some embodiments of the present disclosure, the perovskite layer contained in the final full stack, resulting from the combining, physical contacting of the first perovskite layer/composition with the second perovskite layer/composition may be different than either of the starting perovskite layers/compositions and/or either of the precursor formulations, as determined by at least one of the crystal structure, concentrations and/or stoichiometry (e.g. of at least one of A-cations, B-cations, and/or X-anions), morphology, physical properties, and/or performance metrics. At least one of the measurable perovskite parameters may be present in the perovskite layer as a gradient. In some embodiments, the concentration of at least one of the A-cations, B-cations, and/or X-anions may vary as a function of thickness and/or position within the final combined perovskite layer. This may be case even in examples using the same starting perovskite composition for each of the starting perovskite layers of the respective two or more partial stacks. Such A-cation, B-cation, and/or X-anion concentration gradients across the thickness of a perovskite layer may be measured using a suitable analytical method such as TOF-SIMS (time-of-flight secondary ion mass spectrometry).

Figure 4:
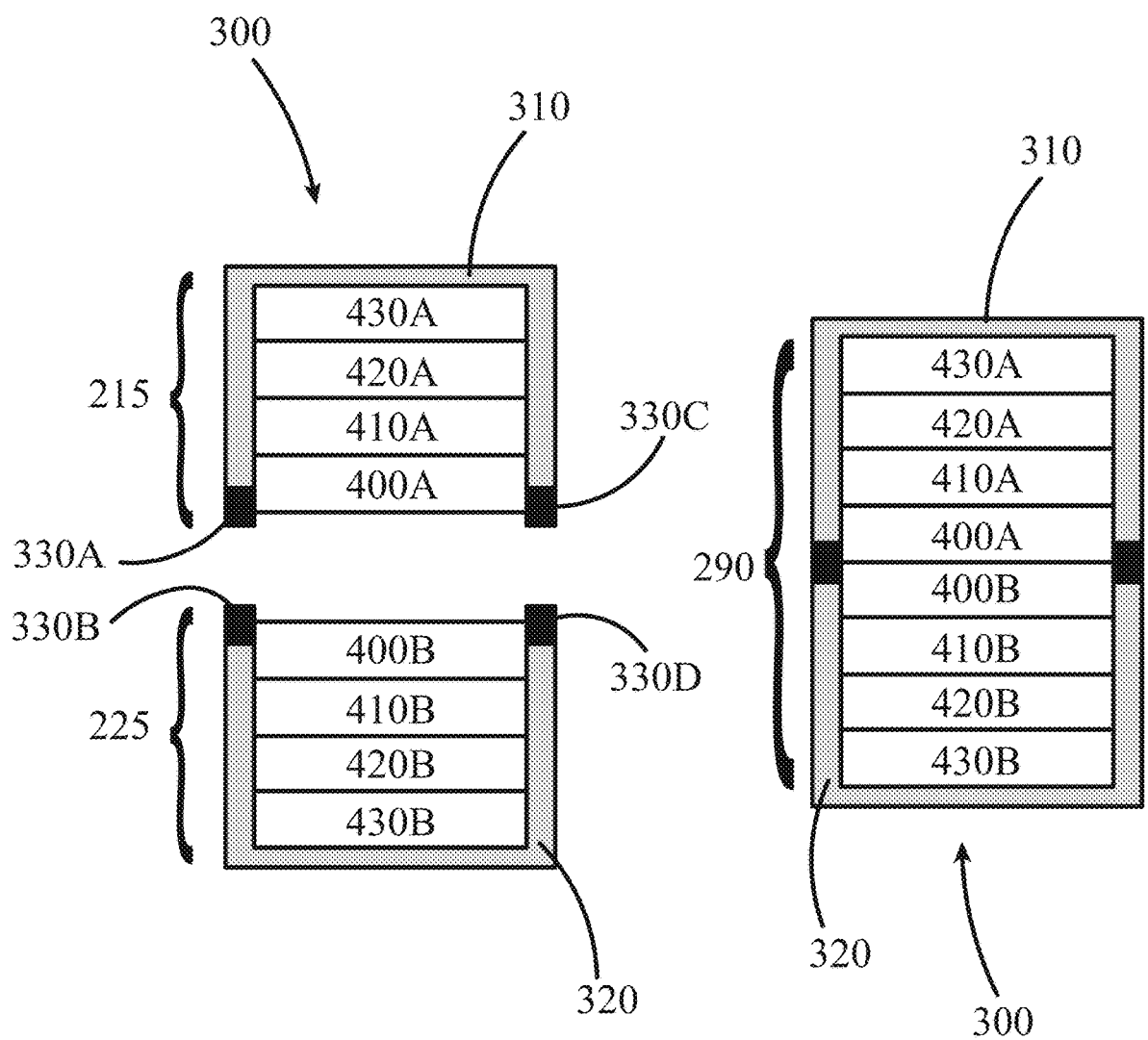
FIG. 4 illustrates a method for making a perovskite-containing device, according to some embodiments of the present disclosure.

FIG. 4 illustrates a schematic of the partial stacks (215 and 225) and the full stack 290 resulting from the fabricating (210 and 220) steps and the combining 230 step shown in FIG. 2. As described above, two perovskite-containing devices, a first partial stack 215 and a second partial stack 225 may be independently fabricated and then physically combined together at the two perovskite-perovskite surfaces to form a final perovskite PV device 290. In some embodiments of the present disclosure, each of the two perovskite-containing devices (the first partial stack 215 and the second partial 225) may include at least one of a current collecting layer 420 (420A and 420B shown; one for each partial stack) (e.g. a transparent current collecting layer such as a transparent conductive oxide), a charge transport layer 410 (410A and 410B shown; one for each partial stack) (e.g. HTL and/or ETL; one for each partial stack), a substrate 430 (430A and 430B shown; one for each partial stack), and/or any other layer and/or other material as needed for a particular final full-stack perovskite-containing device 290 design. Using UV-Visible absorption spectroscopy, external quantum efficiency, x-ray diffraction, and time-resolved photoluminesence spectroscopy, it is shown herein that these procedures and methods can improve the properties of the final, resultant perovskite devices (e.g. photovoltaic devices). Applying these methods, semi-transparent full stack perovskite-containing PV devices were fabricated from two partial stacks, each containing an oxide transport layer, where the full stack PV devices demonstrated an average power conversion efficiency (PCE) of 9.6% (maximum 10.6%). Overall, the procedures developed and described herein curtail processing constraints, enabling new perovskite-containing device designs, including reflective back contact designs, and afford new opportunities for producing better performing, more cost-effective perovskite-containing devices such as photovoltaics.

Referring again to FIG. 4, the first partial stack 215 is shown positioned within a depression formed by the first surface 310 of a pressure and/or heating device 300 (e.g. a press) and the second partial stack 225 is shown positioned with a depression formed by the second surface 320 of the pressure and/or heating device 300. Thus, in some embodiments of the present disclosure, the first partial stack 215 and the second partial stack 225 may be fabricated independently of one another, at different times, or substantially simultaneously. In some embodiments of the present disclosure, one or more of the elements of at least one of the partial stacks (215 and/or 225) may be positioned and/or deposited within the pressure and/or heating device 300 prior to the combining 230 step. In some embodiments of the present disclosure, the partial stacks may be prefabricated, including the perovskite layer, and then loaded into the pressure and/or heating device 300 to be joined in the combining 230 step. For example, the first partial stack 215 may be fabricated by the positioning of a substrate 430A within the depression of the first surface 310, followed by the liquid and/or vapor deposition of a current collecting layer 420A onto the substrate, followed by the liquid and/or vapor deposition of a charge transport layer 410A onto the current collecting layer 420A, followed by the liquid and/or vapor deposition of a perovskite layer 400A onto the charge transport layer 410A. The second partial stack 225 may then be similarly fabricated in the depression of the second surface 320 of the pressure and/or heating device (e.g. a press). Once the two partial stacks are assembled, the first surface 310 and the second surface 320 of the pressure and/or heating device 300 may be brought together, physically joining the opposing surfaces of the outermost layers of the opposing partial stack, resulting in the forming of the full stack 290. As described for FIG. 3, one or more seals 330 (330A-D) may be positioned around the perimeter of at least one of the first surface 310 and/or second surface 320 to maintain a gas-tight seal to prevent any of starting components from escaping the pressure and/or heating device 300.

Thus, the present disclosure relates to methods that combine at least two independently processed perovskite-containing devices and/or layers (partial stacks) resulting in a final perovskite-containing device, or full stack. As shown herein, this method circumvents a number of limitations common in many of the incumbent technologies used to produce perovskite-containing devices and may be applied to a wide range of materials used in perovskite optoelectronic devices. In one embodiment of the present disclosure, a full stack perovskite-containing solar cell was produced by combining a first partial stack that included, in order, a first fluorine-doped tin oxide (FTO) coated glass substrate, a tin oxide ($SnO_x$) electron transport material (ETM), and a first methylammonium lead triiodide ($CH_3NH_3PbI_3$, MAPI) perovskite active layer (abbreviated FTO/$SnO_x$/MAPI) with a second partial stack that included, in order, and a second fluorine-doped tin oxide (FTO) coated glass substrate, a nickel oxide ($NiO_x$) hole transport material (HTM), and a second methylammonium lead triiodide ($CH_3NH_3PbI_3$, MAPI) perovskite active layer (abbreviated FTO/$NiO_x$/MAPI). The architecture of the resultant full stack perovskite-containing device is abbreviated as FTO/$SnO_x$/MAPI/MAPI/$NiO_x$/FTO.

Due to the potentially complex interplay between perovskite materials and other device material layers, minor changes in substrate preparation, solution stoichiometry, deposition parameters, and annealing conditions may alter film formation and composition, for example the amount of lead iodide ($PbI_2$) present in films. Using the $CH_3NH_3PbI_3$ (100) and $PbI_2$ (001) peak area ratios obtained from powder X-ray diffraction (XRD), the ratios of $CH_3NH_3PbI_3$-to-$PbI_2$ in each device was maximized so that the presence of $PbI_2$ could be used as an indicator of the following thermal degradation pathway in laminated devices:

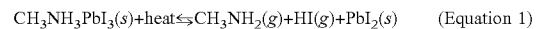

$$CH_3NH_3PbI_3(s) + \text{heat} \rightleftharpoons CH_3NH_2(g) + HI(g) + PbI_2(s) \quad \text{(Equation 1)}$$

Note that while the reaction above is reversible and occurs at temperatures as low as 100° C., two of the three reaction products (on the right side of Equation 1) are capable of off-gassing, which may result in driving the reaction forward as predicted by Le Chatelier's Principle. In contrast, the process of combining a first partial stack with at least one second partial stack as described in the present disclosure encapsulates the gases formed in thermal decomposition between the two glass substrates and prevents the driving Equation 1 to the degradation products on the right.

Figure 5:
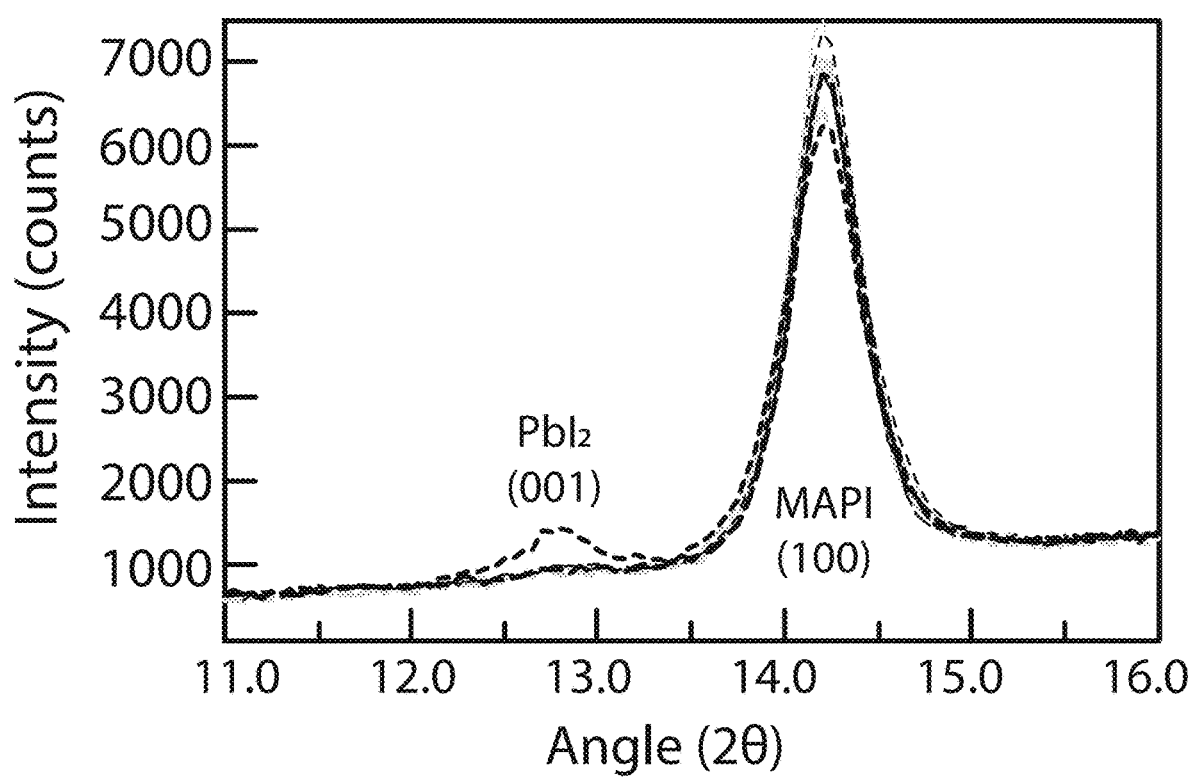
FIG. 5 illustrates x-ray diffraction (XRD) data for methylammonium lead triiodide ($MAPbI_3$ or MAPI) perovskite layers on $SnO_x$ and $NiO_x$ as a function of the perovskite's time at temperature, according to some embodiments of the present disclosure. $PbI_2$ (001) [$2\theta=12.8°$] and MAPI (100) [$2\theta=14.2°$].

By forming a smooth (e.g. as defined by a mean roughness or maximum valley to peak roughness having a value of about 10 nm) charge transport layer, and utilizing a MAPI solution with a MAI to $PbI_2$ ratio (e.g. at a molar ratio of 1:1.04 of MAI:$PbI_2$), and annealing the resulting perovskite for at least 15 minutes at 100° C., MAPI films were formed from two partial stacks, each composing MAPI, with little to no $PbI_2$ degradation product evident in either of the starting partial stacks one containing $SnO_x$ and the other containing $NiO_x$. FIG. 5 illustrates the affects of individually heating (at 100° C.) partial stacks for different time periods. The lighter lines correspond to data for partial stacks made of, in order, a glass substrate, a NiO$_x$ charge transport layer, and a MAPI perovskite layer. The darker lines correspond to data for partial stacks made of, in order, a glass substrate, a SnO$_x$ charge transport layer, and a MAPI perovskite layer. For both partial stack types, the heavy short-dashed lines correspond to data for no heating; the heavy long-dashed lines correspond to data for 15 minutes of heating; the light short-dashed lines for 30 minutes of heating; and the light long-dashed lines is for 45 minutes of heating.

FIG. 5 illustrates that the performance improvements resulting from the combining of two partial stacks to create a full stack is not simply due to the time spent at temperature during the combining step. Specifically, FIG. 5 illustrates that neither a partial stack made of FTO/NiOx/MAPI, nor a partial stack made of FTO/SnOx/MAPI, demonstrated significant generation of PbI$_2$ by the reaction of Equation 1, when heated at 100° C. for a time period between greater than zero minutes and 45 minutes. As will be shown below, combining two partial stacks of MAPI at 100° C. and higher, for similar times and at elevated pressures, also resulted in no significant formation of PbI$_2$, but did result in other measurable improvements to other performance metrics. For example, partial stacks like those used to produce the data illustrated in FIG. 5, were physically combined in a hot press (see FIG. 9) at approximately 300 psi and approximately 150° C. for 20 minutes. Although a hot press was utilized in this example, any other equipment may be utilized to combine a first device containing a perovskite layer with a second device containing a perovskite, provided it can supply the temperatures and pressures for the periods of time needed to laminate the two devices together. Examples include between two rollers and/or a vacuum laminator.

Figure 6A:
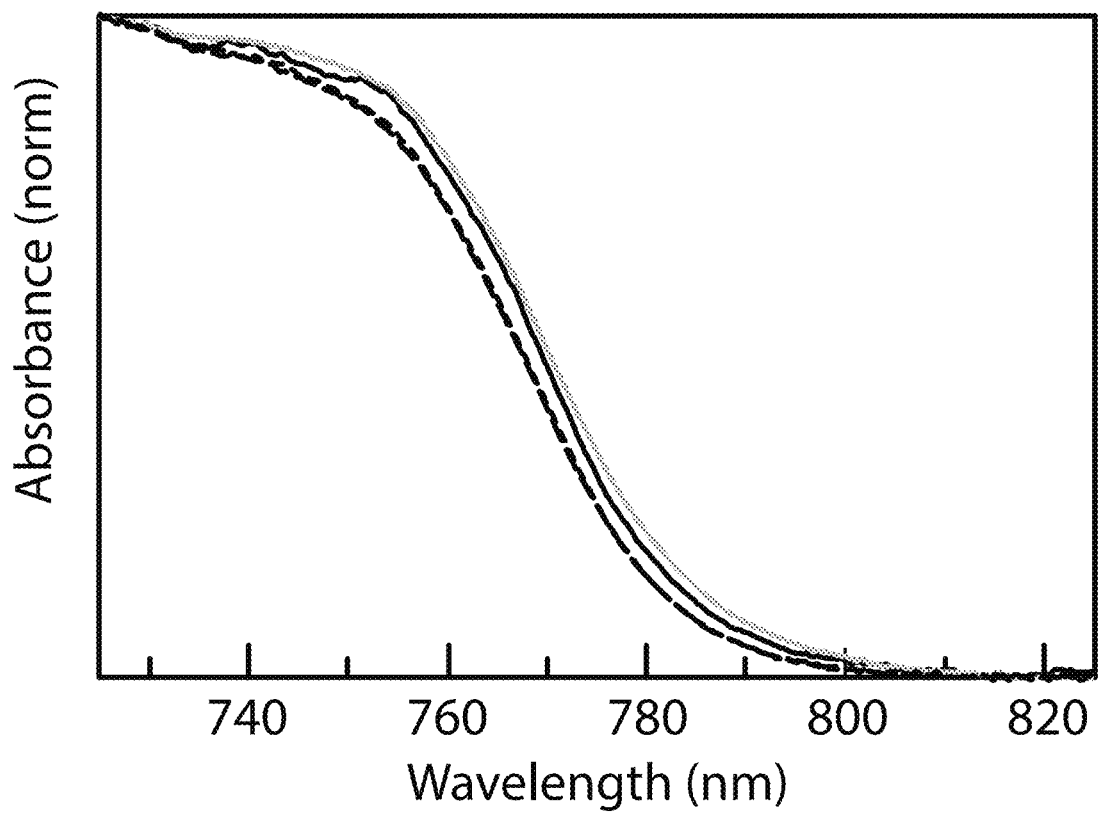
FIG. 6A illustrates absorbance spectroscopy data for partial stacks containing MAPI perovskite layers, the full stack device resulting from the combining of the two partial stacks, and for partial stacks resulting from the subsequent separation after the full stack was formed.
Figure 6B:
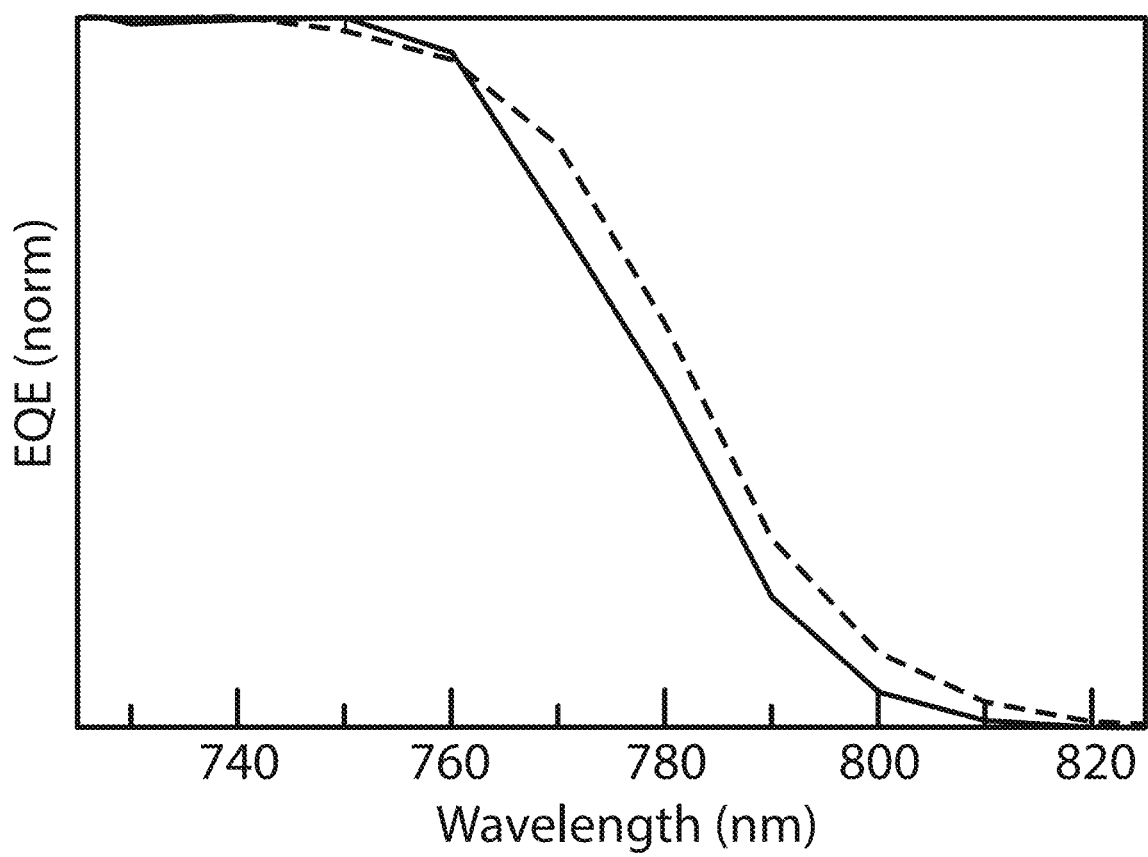
FIG. 6B illustrates external quantum efficiency (EQE) data for a MAPI full stack device compared to a control full stack, according to some embodiments of the present disclosure. The solid line corresponds to the control and the dished line to the full stack made according to some embodiments of the present disclosure.
Figure 6C:
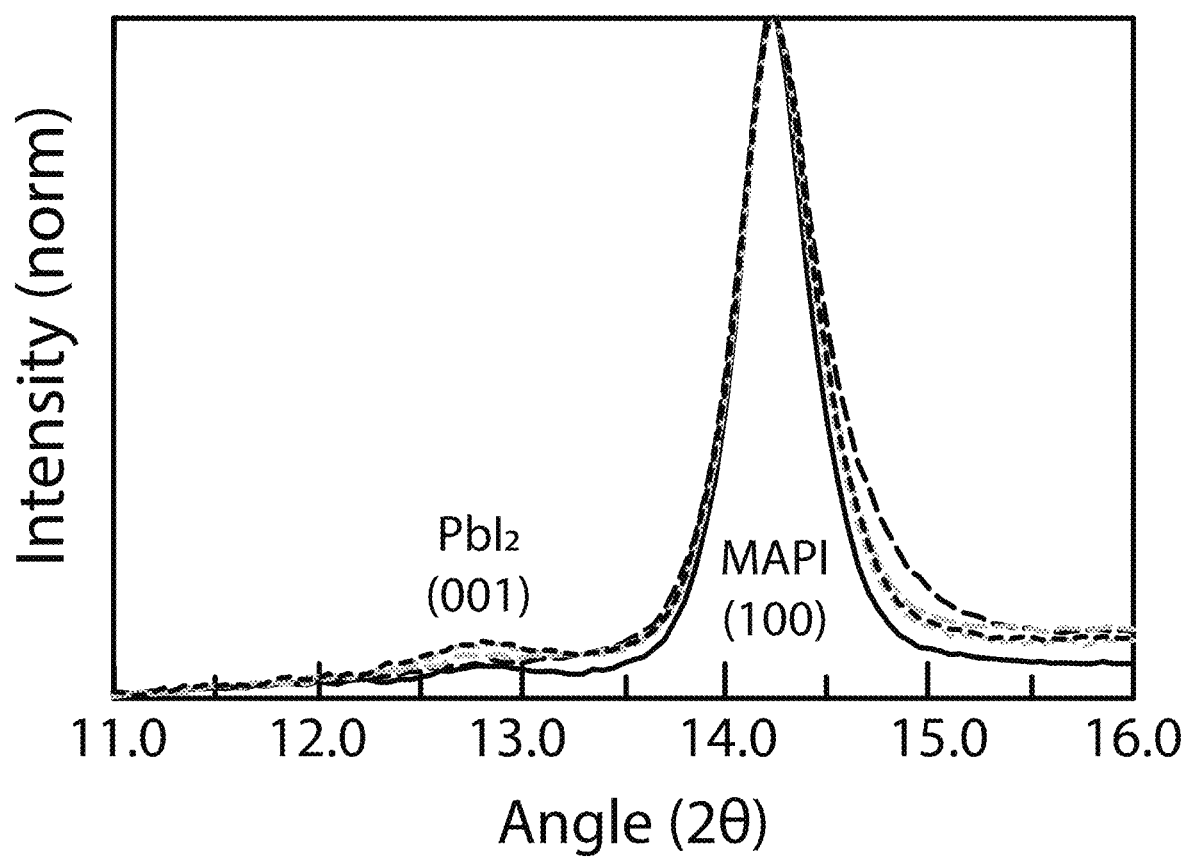
FIG. 6C illustrates x-ray diffraction data of $PbI_2$ (001) and MAPI (100) peaks, according to some embodiments of the present disclosure.
Figure 6D:
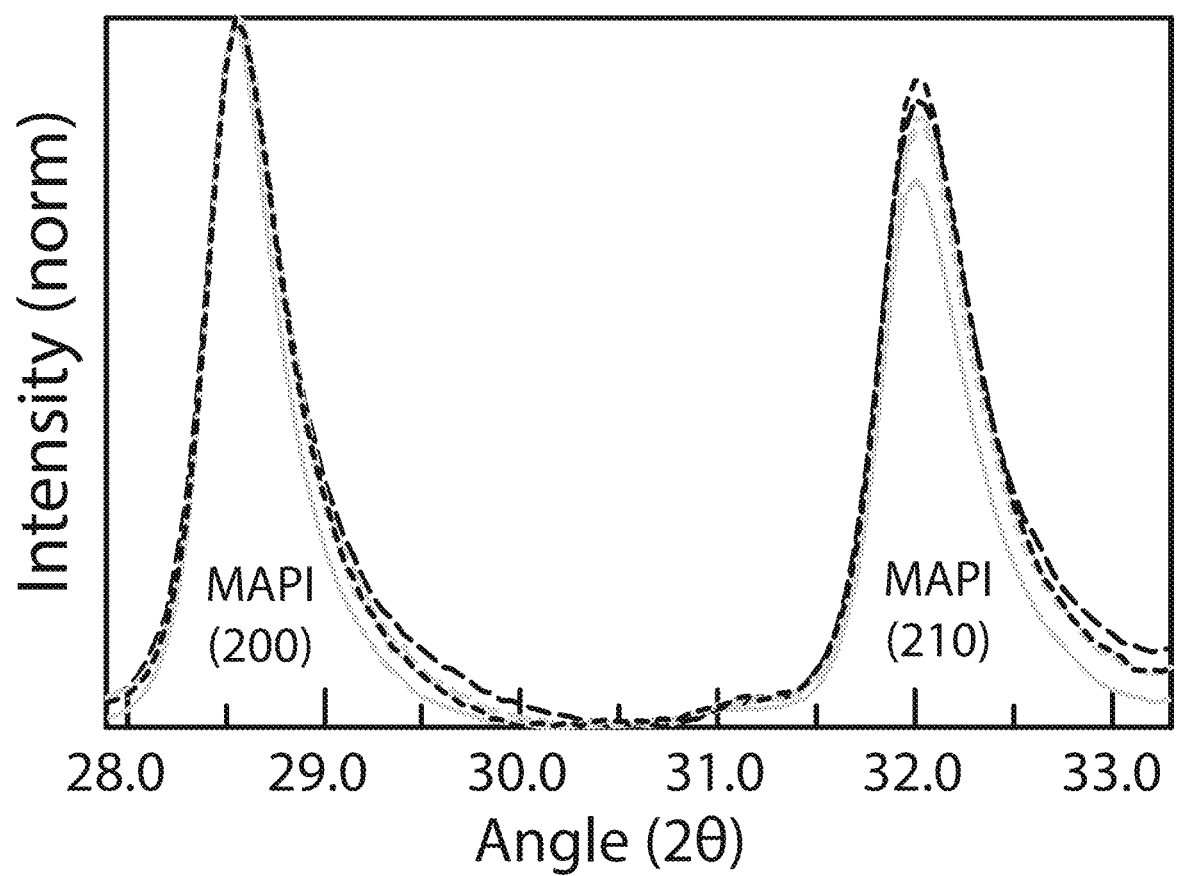
FIG. 6D illustrates x-ray diffraction data of MAPI (200) and (210) peaks, according to some embodiments of the present disclosure.
Figure 6E:
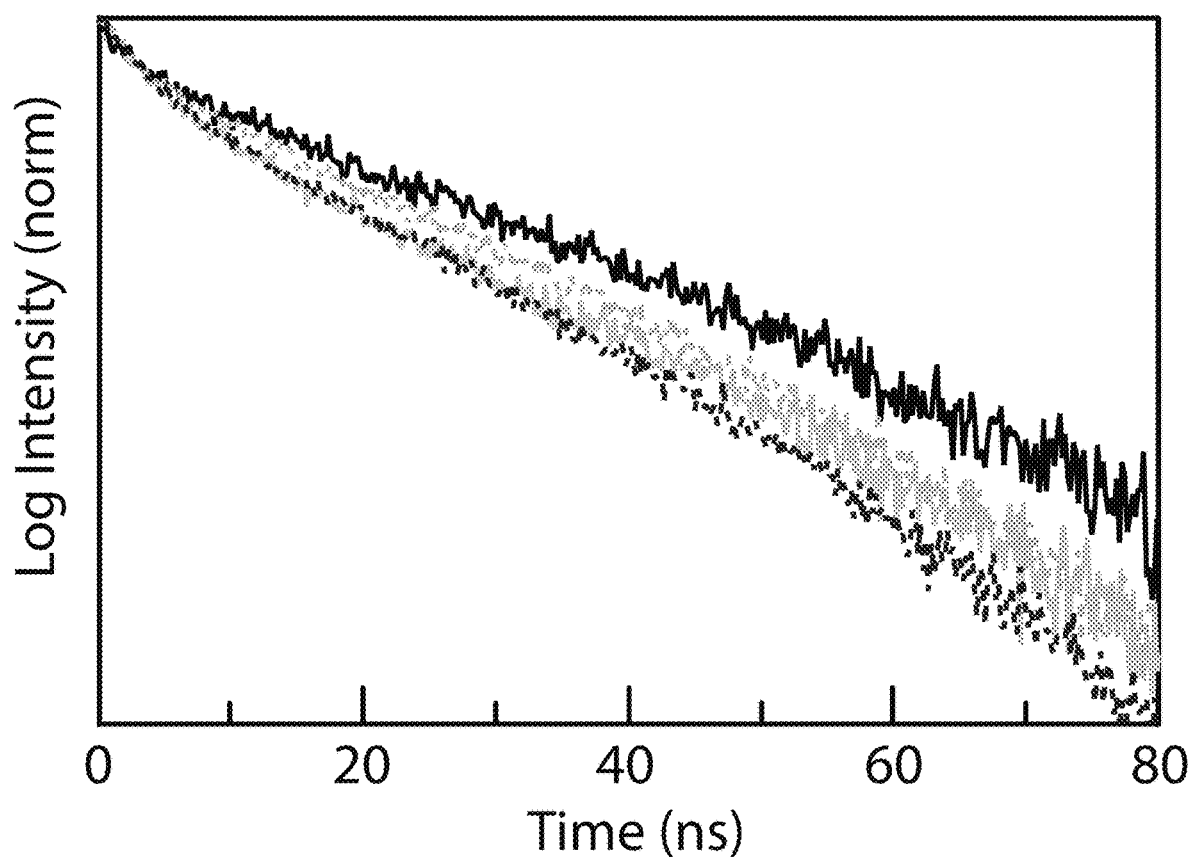
FIG. 6E illustrates time-resolved photoluminescence spectroscopy data for partial stacks containing MAPI perovskite layers, the full stack device resulting from the combining of the two partial stacks, and for partial stacks resulting from the separation of the full stack.

To measure the effect of the combining step of the two partial MAPI-containing stacks (e.g. heat and pressure) on the resultant perovskite active layer of the full stack, a series of analyses were conducted including UV-Visible absorption spectroscopy (see FIG. 6A), external quantum efficiency (EQE) (see FIG. 6B), X-ray diffraction (XRD) (see FIGS. 6C and 6D), and time-resolved photoluminesence spectroscopy (TRPL) (see FIG. 6E). Absorbance spectra were obtained for both partial stacks, FTO/SnO$_x$/MAPI (long-dashed line set in FIG. 6A) and FTO/NiO$_x$/MAPI (short-dashed line set in FIG. 6A) (e.g. first partial stack 215 and second partial stack 225, respectively), the resultant full stack perovskite-containing PV device 290 (the solid line in FIG. 6A) (FTO/SnO$_x$/MAPI/MAPI/NiO$_x$/FTO), and subsequently partial stacks separated from the previously formed full stack (the lighter solid line) with FTO/SnO$_x$ or NiO$_x$ references using the transmission and reflection spectra calculated from data acquired using an integrating sphere. Separating the partial stacks from each other was achieved by forcibly twisting overhanging edges in opposite directions. As separating the full stack back to its original constituent partial stack components was difficult, FIGS. 6A, C, and D illustrate results for only one of the recovered partial stacks, the FTO/NiO$_x$/MAPI partial stack. This is because, once a threshold thermal budget was provided to the full stack device, the two original MAPI layers would physically connect in such a way that is prevents a clean separation at their original surface-to-surface interface. Instead, once that threshold thermal budget was achieved, attempts to separate the full stack tended to result in a cleaving at the MAPI/SnO$_x$ interface, resulting in a first separated partial stack that included only FTO/SnO$_x$, and a second separated partial stack that included MAPI-combined-to-MAPI/NiO$_x$/FTO.

However, it is considered within the scope of the present disclosure to include a "release" layer between the two initial opposing perovskite layers, such that their subsequent release is possible, without destroying either of perovskite layers when attempting subsequent separation. Thus, in some embodiments of the present disclosure, a release liner may be provided that allows the mass-transfer between the adjacent perovskite layers of the two or more partial stacks, such that, among other things, the resultant final perovskite layer contains concentrations of at least one of the A-cation(s), B-cation(s), and/or X-anion(s) along the axis measuring its thickness. Release layers may include materials such as oxides, fullerenes, functionalized fullerenes, graphene, silicene, MoS$_2$, and/or low dimensional perovskites such as CsPbI$_3$ quantum dots, and/or methylbenzylammonium lead iodide. For the remainder of this disclosure, whether two perovskite layers can be separated after their initial combining or not, will not be distinguished, and either case will be abbreviated using the term "MAPI/MAPI" or more generally, "perovskite/perovskite".

To account for varying perovskite and glass thickness while maintaining the shape and location of the band edge, curves were linearly normalized. As shown in FIG. 6A, the absorption data indicate that the combining step may decrease the band gap of the resultant MAPI/MAPI layer and may maintain or sharpen the features at the absorption band edge, corresponding to a modification of the conduction and/or valence band edge structures and associated defects. The subsequent separation of the combined full stack at the SnO$_x$/MAPI interface appears to further reduce the band gap of the separated perovskite layer and partially revert the shape of the band edge back to its pre-combined, partial stack form.

Changes in absorption were measured using EQE measurements on a full-stack perovskite-containing device (FTO/SnO$_x$/MAPI/MAPI/NiO$_x$/FTO) formed by the combining of a first MAPI-containing partial stack (FTO/SnO$_x$/MAPI) with a second MAPI-containing partial stack (FTO/NiO$_x$/MAPI) and compared to a control FTO/SnO$_x$/MAPI/Spiro-OMeTAD/MoO$_x$/Al device, produced without the combining of a first MAPI-containing partial stack with a second MAPI-containing partial stack. To compare the shape of the EQE band edges, spectra were again normalized as above. The red shift measured in EQE, shown in FIG. 6B, agrees with that of the absorption measurements of FIG. 6A, within the resolution of the instrument (~5 nm). To ascertain to what extent the changes in the optical spectra correlate to structural changes induced by the combining process, pre-combined devices (the two partial stacks used to produce the final full stack perovskite-containing device) fabricated with typical annealing conditions (e.g. time at temperature), pre-combined partial stacks with additional thermal annealing, e.g. for at least an addition time between one second and two hours at about 100° C., and separated partial stack (e.g. after the combining of the initial partial stacks) were analyzed via XRD.

FIGS. 6C and 6D illustrate these XRD results, specifically for each partial stack (FTO/SnO$_x$/MAPI (long-dashed lines in FIGS. 6C and 6D) and FTO/NiO$_x$/MAPI (short-dashed lines in FIGS. 6C and 6D) annealed (heat treated) at 100° C. for 20 minutes (dark dashed lines in FIGS. 6C and 6D) and 40 minutes (light dashed lines in FIGS. 6C and 6D), as well as the separated partial stack (the light solid line in FIGS. 6C and 6D) (FTO/NiO$_x$/MAPI) obtained after the forming of the full stack (data not shown). The results, shown normalized to the most intense peak for clarity in FIGS. 6C and 6D, display three potential trends for the final combined full stack perovskite PV devices (FTO/SnO$_x$/MAPI/MAPI/NiO$_x$/FTO), as inferred from data obtained from the separated partial stack: a decrease in the full width at half maximum of all peaks attributed to MAPI, an increase in the MAPI (200)-to-MAPI (210) ratio, and an invariance in the PbI$_2$ (001)-to-MAPI (100) ratio. Note that improvements of similar magnitude are not seen in perovskite PV devices with additional thermal input. This suggests that something particular afforded by the initial combining of the starting partial stacks to produce the full stack, followed by the successive separation of the partial stacks, results in increased crystallinity and an orientation of domains to favor the (100) crystal orientation with no detectable thermal decomposition. The results are consistent with other measurements, providing evidence that changes to the electronic structure arise in part by a change in morphology.

Referring to FIG. 6E, to correlate these optical and morphological changes to a functional property of the photovoltage, time-resolved photoluminesence spectroscopy was conducted on glass/MAPI partial stacks (referring to FIG. 6E: the light dashed line corresponds to 20 minutes of heat treating at 100° C.; the dark dashed line corresponds to 40 minutes of heat treating at 100° C.), and the resultant combined glass/MAPI/MAPI/glass full stack (the dark solid line in FIG. 6E), and separated glass/MAPI partial stacks (the lighter solid line in FIG. 6E). As lifetimes are known to correlate with excitation intensity, analysis was conducted using 450 nm wavelength excitation through the glass face of the sample at constant excitation fluence. While the glass backside of the laminated perovskite PV device may result in varied amounts of attenuation and scattering, all perturbations are intensity independent and therefore should not affect lifetime. Despite optimal sample orientation and constant fluence, variations in the density of free charge carriers generated during excitation are expected due to the differences observed in absorption. Although lifetimes at shorter time scales are heavily perturbed by complex free-carrier density-dependent effects, such as band gap renormalization and bimolecular recombination, longer time scales where trap-mediated recombination processes dominate recombination kinetics are expected to have smaller intensity dependence.

Consequently, the logarithm of the intensity is highly linear after the initial several nanoseconds as shown in FIG. 6E. To account for this, data were truncated for fitting to exclude points prior to 20 ns, such that a single-exponential fit produces small residuals. The results show that the full stack perovskite PV devices resulting from the combining of a first perovskite-containing partial stack with a second perovskite-containing partial stack may exhibit longer higher carrier lifetimes of ~53 ns, compared to ~41 ns for the separated partial stack, ~39 ns for the pre-combined partial stack with normal thermal input, and ~32 ns for the pre-combined partial stack with additional thermal input. Therefore, the manufacture of a final full stack perovskite-containing device by the combining of a first perovskite-containing partial stack with a second perovskite-containing partial stack appears to beneficially alter the material quality of the resultant combined perovskite layer by reducing the concentration of defects/traps and improving the photophysical properties and morphological structure.

Figure 6F:
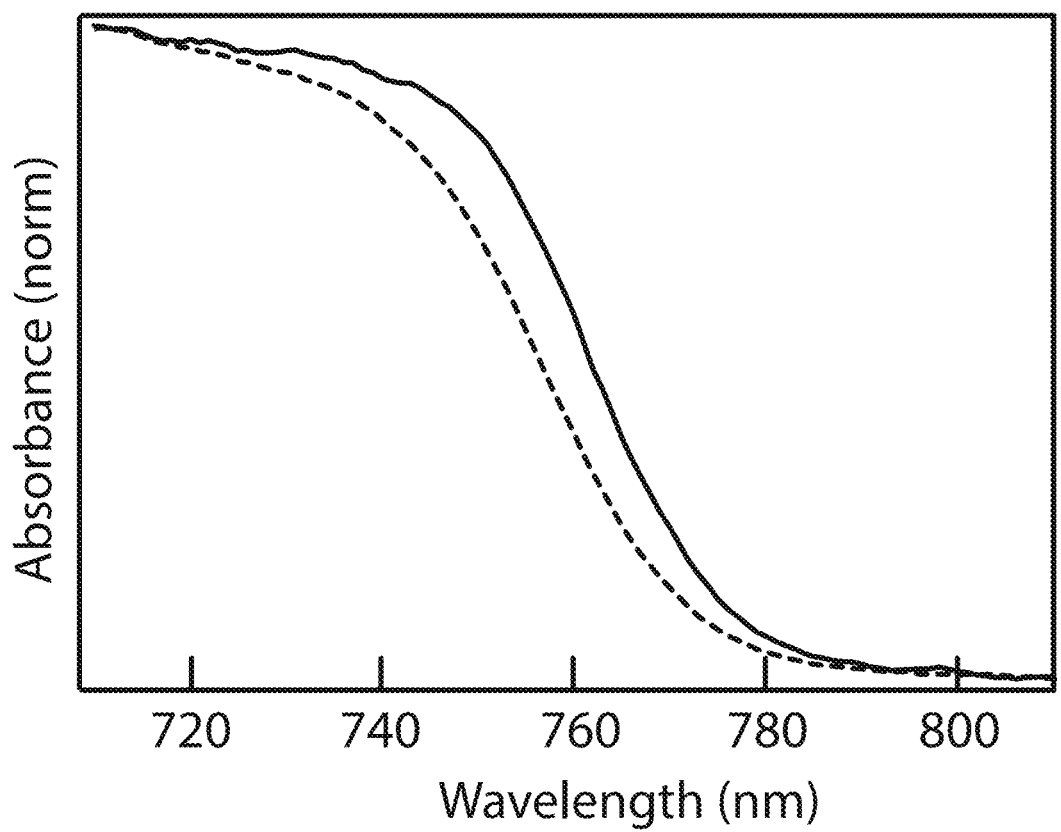
FIG. 6F illustrates absorbance spectroscopy data for a full stack (solid line) and a partial stack (dashed line) using a MAPI perovskite material, according to some embodiments of the present disclosure.

FIG. 6F illustrates absorbance spectroscopy data for a full stack (solid line) and a partial stack (dashed line). In this experiment, two partial stacks, each made of a FAMACsPbIBr perovskite layer deposited on an FTO currently collecting layer, were combined to make a full stack of FTO/FAMACsPbIBr/FAMACsPbIBr/FTO. Lamination was carried out at 350 psig and 180 C using the same technique described in "Lamination/Delamination Procedure" of the "Experimental" section below. These data show that the enhancements seen in the MAPI film, as measured by absorbance spectroscopy, appear in the FAMACsPbIBr film.

Figure 6G:
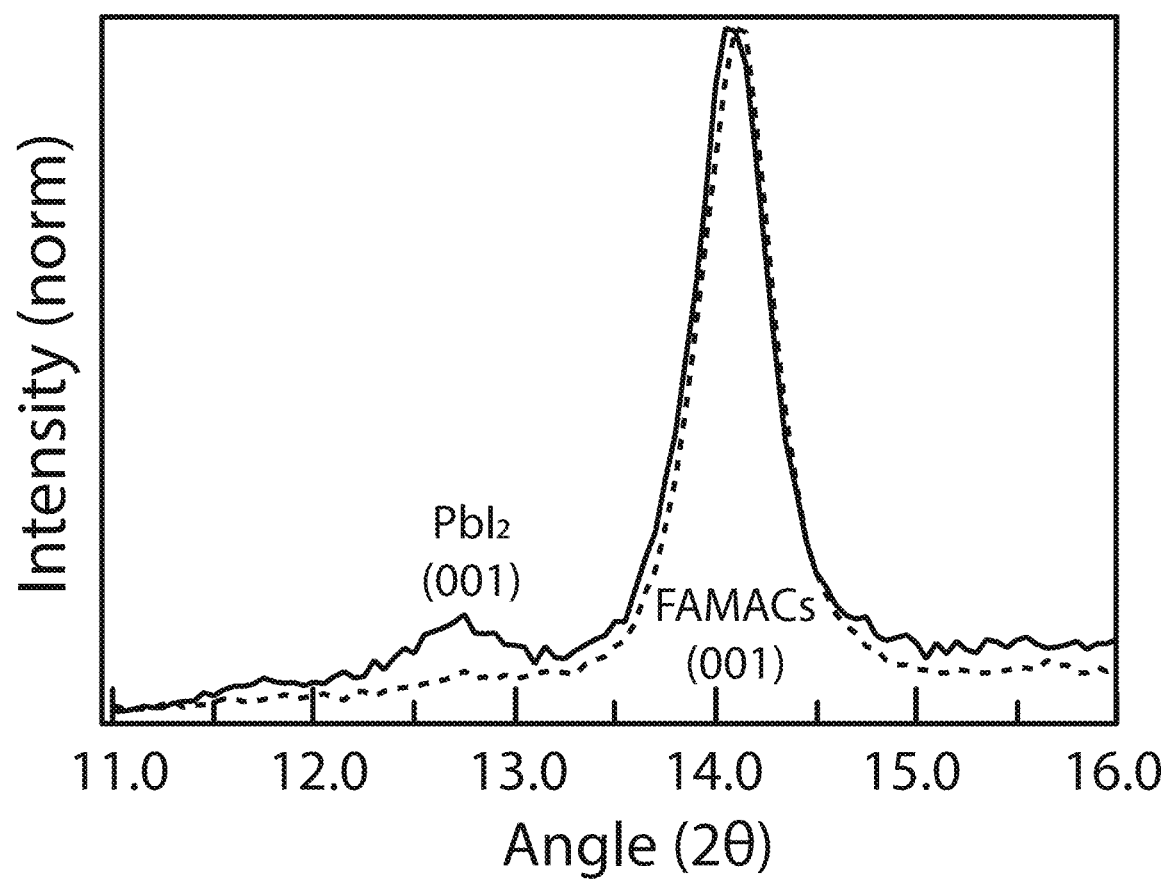
FIGS. 6G and 6H illustrate x-ray diffraction data for partial stacks and partial stacks after separating them for a full stack made according to methods described herein, where each partial stack included a FAMACsPbIBr perovskite layer deposited on an FTO current collecting layer, according to some embodiments of the present disclosure. ("FA" is formamidinium.)
Figure 6H:
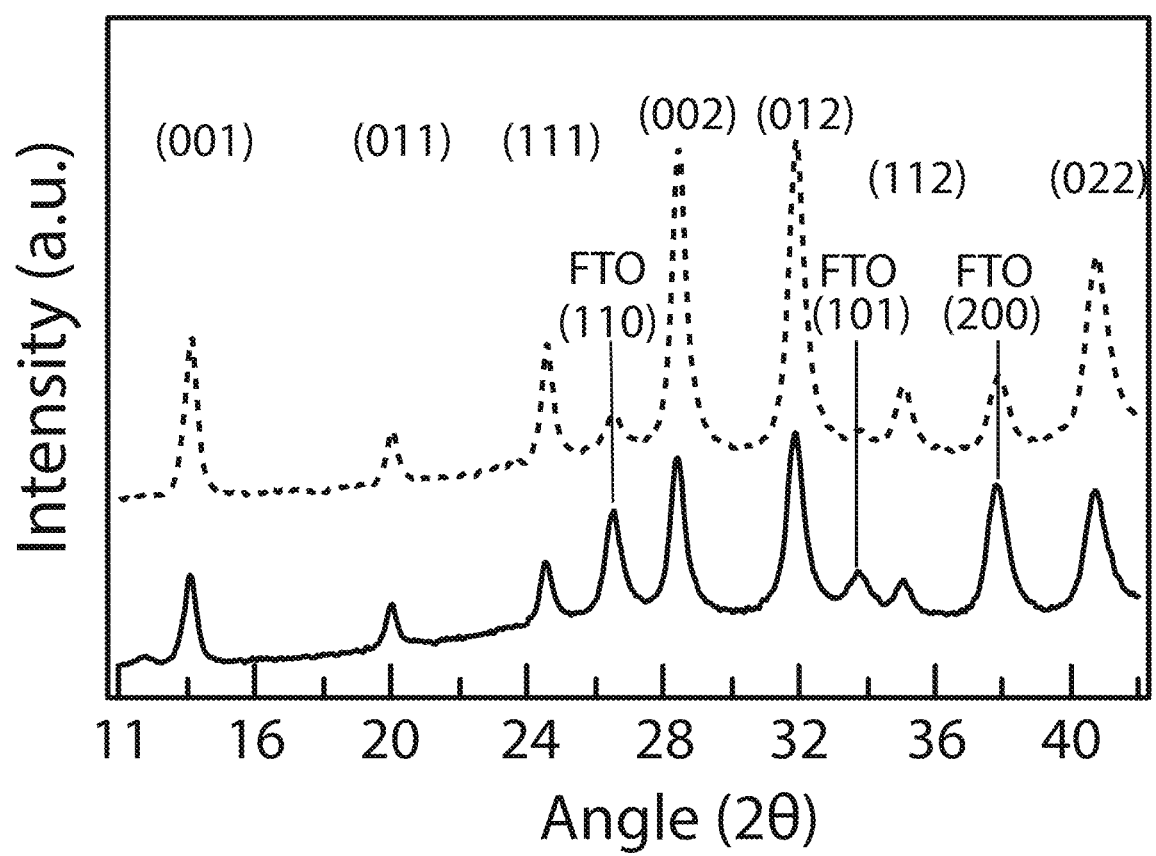

FIGS. 6G and 6H illustrate x-ray diffraction data for partial stacks and partial stacks after separating them for a full stack made according to the methods described herein, where each partial stack included a FAMACsPbIBr perovskite layer deposited on an FTO current collecting layer. Thus, the full stacks produced were FTO/FAMACsPbIBr/FAMACsPbIBr/FTO. FIG. 6G illustrates the peaks corresponding to PbI$_2$ (001) and FAMACsPbIBr (001) and FIG. 6H illustrates various other FAMACsPbIBr peaks and peaks associated with the underlying FTO layer. Lamination was carried out at 350 psig and 180 C using the same technique described in "Lamination/Delamination Procedure" of the "Experimental" section below. These data show that the enhancements seen in the MAPI film, as measured by x ray diffraction, appear in the FAMACsPbIBr film.

Figure 6I:
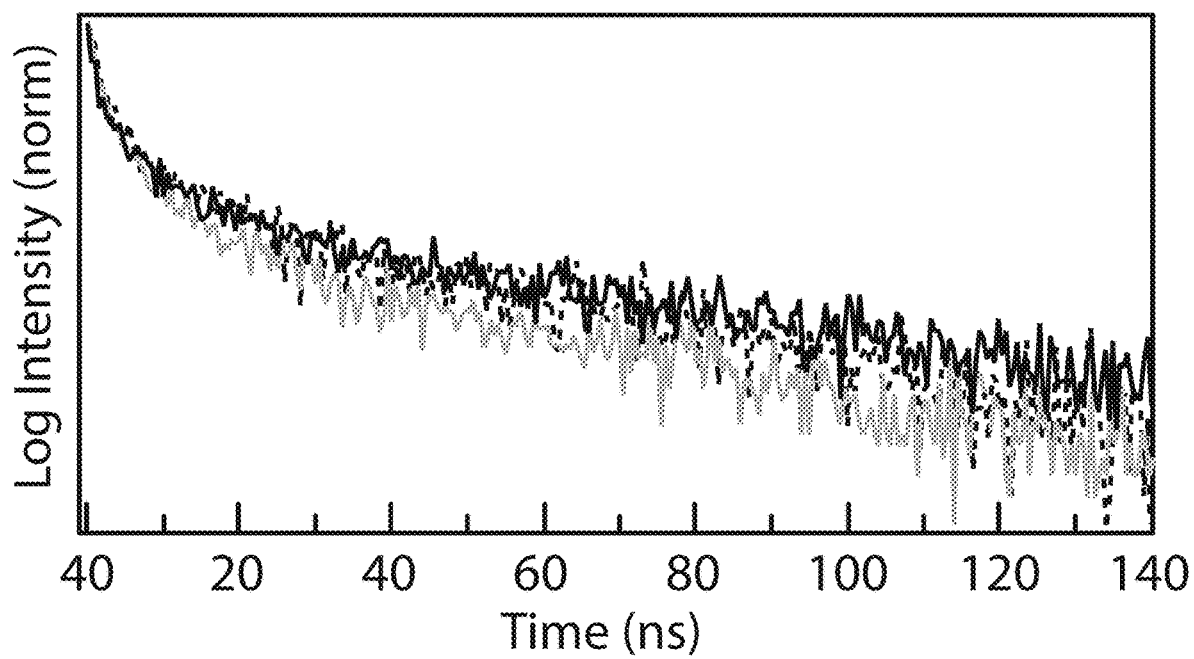
FIG. 6I illustrates time-resolved photoluminescence spectroscopy data for partial stacks containing FAMACsPbIBr perovskite layers, the full stack device resulting from the combining of the two partial stacks, and for partial stacks resulting from the separation of the full stack, according to some embodiments of the present disclosure.

FIG. 6I illustrates time-resolved photoluminescence spectroscopy data for partial stacks containing FAMACsPbIBr perovskite layers, the full stack device resulting from the combining of the two partial stacks, and for partial stacks resulting from the separation of the full stack, according to some embodiments of the present disclosure, where FAMACsPbIBr refers to Cs$_{0.05}$(MA$_{0.17}$FA$_{0.83}$)$_{0.95}$Pb(I$_{0.83}$Br$_{0.17}$)$_3$, although other compositions and/or stoichiometries that include cesium, lead, iodine, bromine, MA, and/or FA may also be produced and fall within the scope of the present disclosure. The partial stacks included a FAMACsPbIBr perovskite layer deposited on glass to produce a full stack of FAMACsPbIBr/FAMACsPbIBr. Referring to FIG. 6I, the partial stack data is represented by the light solid line, the combined full stack by the dark solid line, and the separated partial stack by the dashed line. Lamination was carried out at 350 psig and 180 C using the same technique described in "Lamination/Delamination Procedure" of the "Experimental" section below. These data show that the enhancements seen in the MAPI film, as measured by x-ray diffraction, appear in the FAMACsPbIBr film.

Figure 6J:
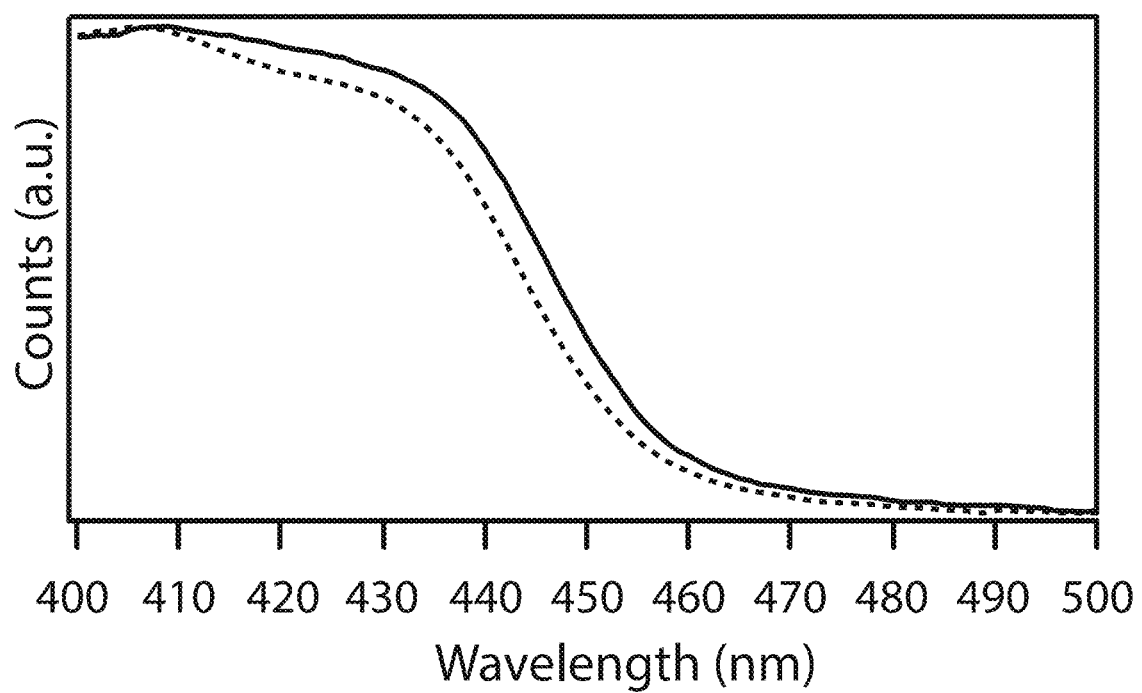
FIG. 6J illustrates absorbance spectroscopy data for a full stack (solid line) and a partial stack (dashed line), where the partial stacks included a $CsPbI_3$ perovskite layer deposited on an FTO currently collecting layer, according to some embodiments of the present disclosure.

FIG. 6J illustrates absorbance spectroscopy data for a full stack (dashed line) and a partial stack (solid line). In this experiment, two partial stacks, each made of a CsPbI$_3$ perovskite layer deposited on an FTO currently collecting layer, were combined to make a full stack of FTO/CsPbI$_3$/CsPbI$_3$/FTO. The partial stacks were combined at a pressure of 350 psig while at a temperature of 325° C. for one hour. These data show that an organic A-cation is not necessary for the successful combining of partial stacks to produce a full stack, and that the same improvements seen for the MAPI stack can also occur using all-inorganic perovskite materials.

Figure 6K:
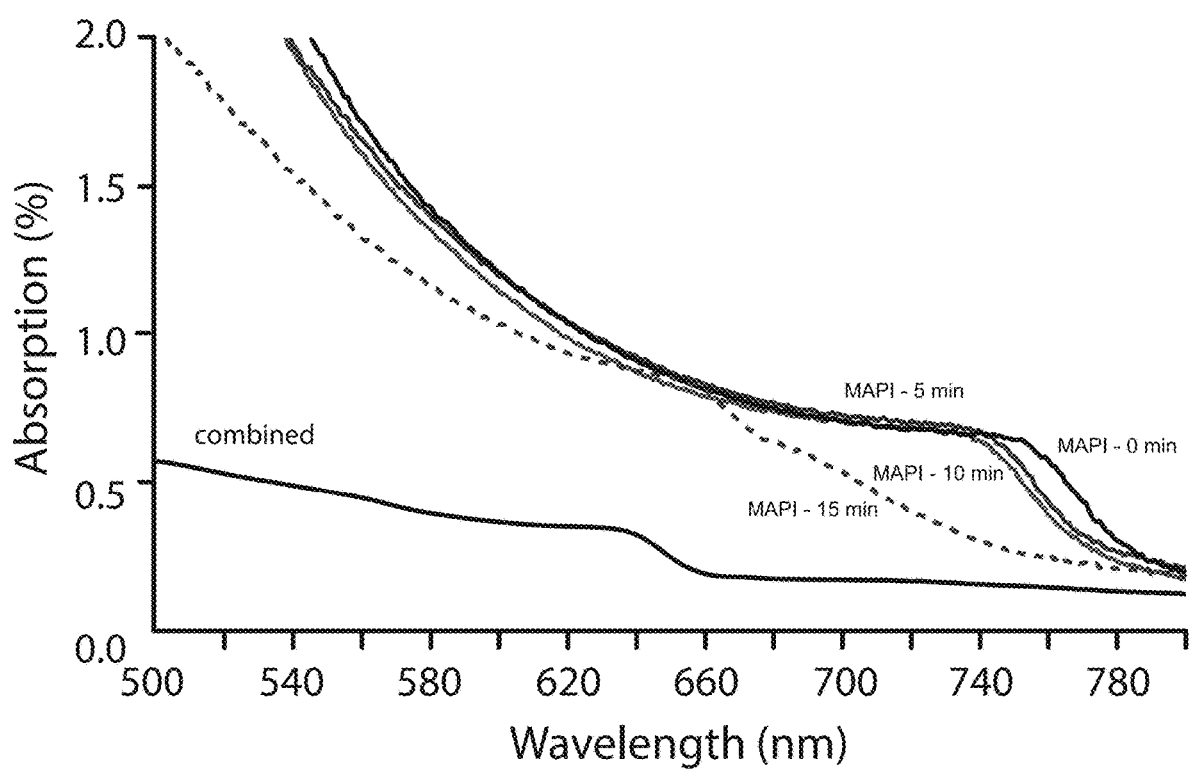
FIGS. 6K and 6L illustrate absorbance spectroscopy data for $MAPbI_3$ partial stacks and $MAPbBr_3$ partial stacks, respectively after heat treating for different times, and the full stack resulting from the combining of a $MAPbI_3$ partial stack with a $MAPbBr_3$ partial stack, according to some embodiments of the present disclosure.
Figure 6L:
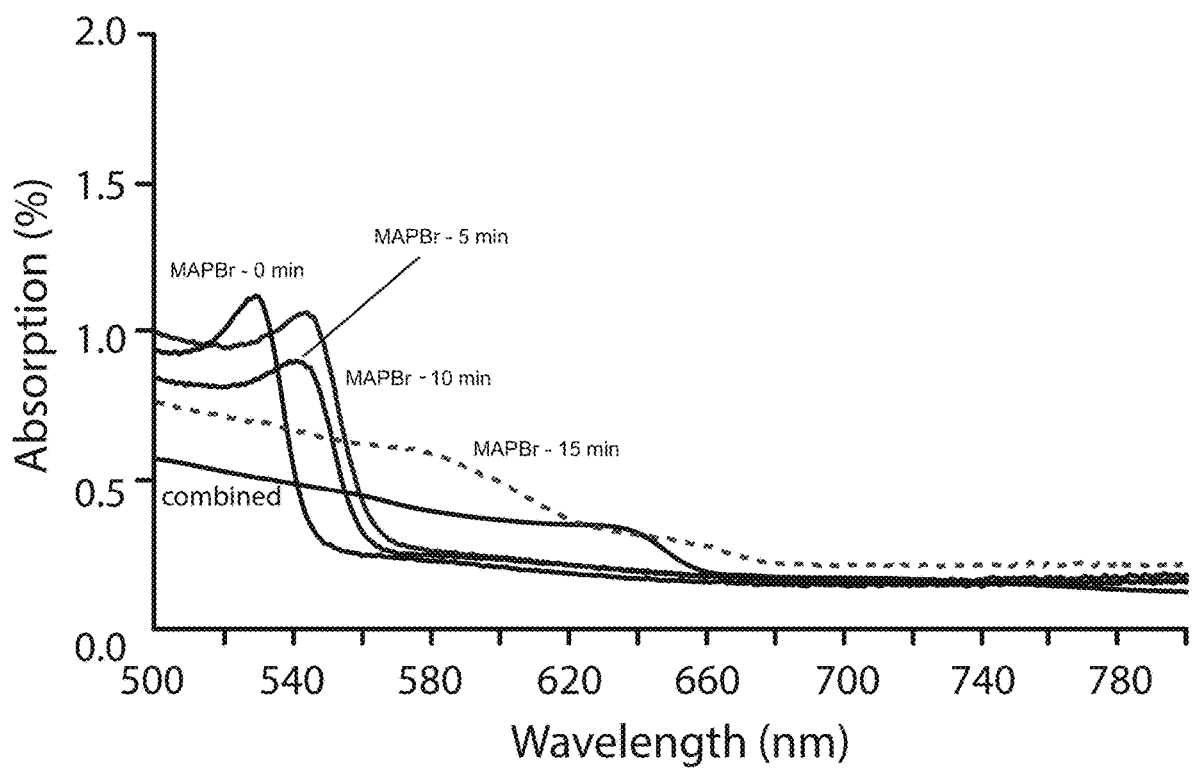
Figure 6M:
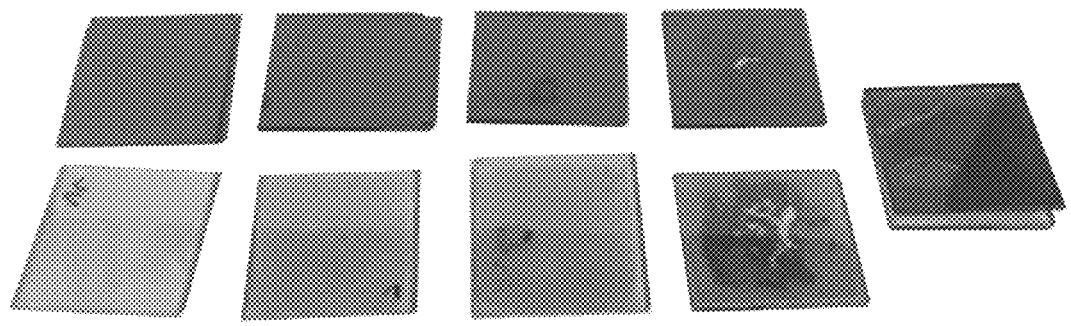
FIG. 6M illustrates photographs of the partial stacks and a full stack corresponding to FIGS. 6K and 6L (top row—substrate/$MAPbI_3$ partial stacks, bottom row—substrate/$MAPbBr_3$ partial stacks, right-most image—combined substrate/$MAPbI_3$/$MAPbBr_3$/substrate full stack), according to some embodiments of the present disclosure.

FIGS. 6K and 6L illustrate absorbance spectroscopy data for MAPbI$_3$ partial stacks and MAPbBr$_3$ partial stacks, respectively after heat treating for different times, and the full stack resulting from the combining of a MAPbI$_3$ partial stack with a MAPbBr$_3$ partial stack. FIG. 6M illustrates the corresponding photos for the MAPI partial stacks (top row, no heat treating, 5 minutes heat treating, 10 minutes, and 15 minutes, from left to right), the MAPbBr$_3$ partial stacks (bottom row, no heat treating, 5 minutes heat treating, 10 minutes, and 15 minutes, from left to right), and the combined MAPbI$_3$ partial stack with a MAPbBr$_3$ partial stack on the far left. Each perovskite partial stack included its respective perovskite layer deposited on an FTO current collecting layer, resulting in a full stack that included FTO/MAPb$(I_xBr_{1-x})_3$/FTO. The combining step was carried out as described in "Lamination/Delamination Procedure" of the "Experimental" section below. This shows that two different half stacks can be used to create a full stack with a composition different than either of the two starting stacks.

Figure 7A:
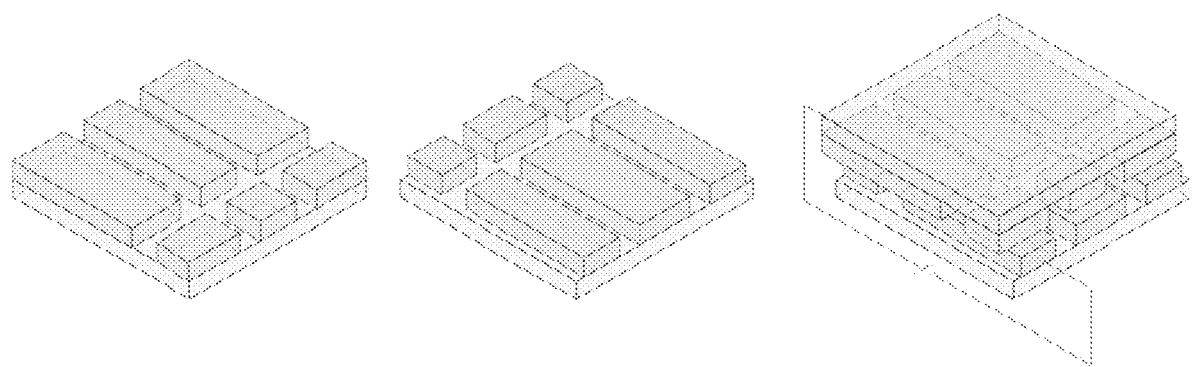
FIG. 7A illustrates a device TCO architecture utilized to create perovskite-containing devices, according to some embodiments of the present disclosure.
Figure 7B:
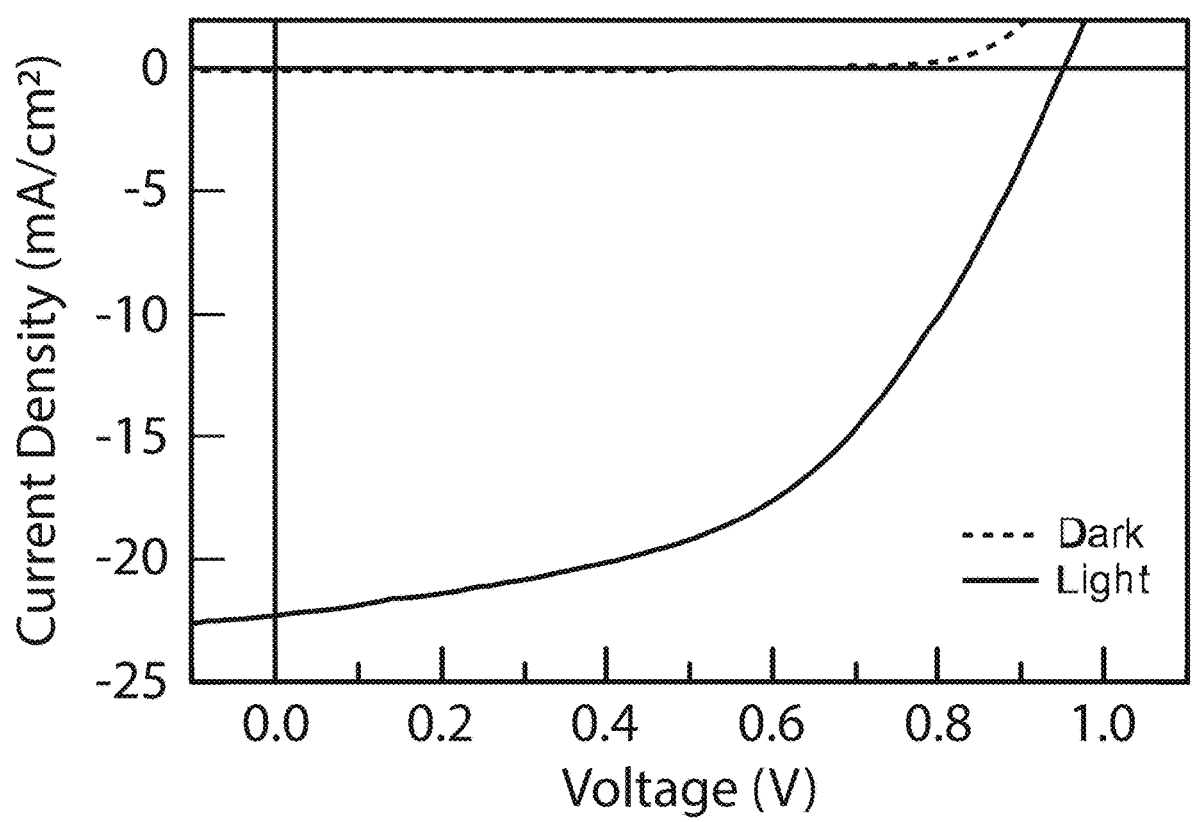
FIG. 7B illustrates the J-V curve for a perovskite-containing device having the TCO architecture illustrated in FIG. 7A, according to some embodiments of the present disclosure.

The combining procedure described in the present disclosure may fabricate devices which feature multiple oxide transport layers ($SnO_x$/MAPI/MAPI/$NiO_x$), an architecture that is generally inaccessible by conventional solution processing methods, due for example, to temperature induced degradation to the underlying perovskite layer(s). FIG. 7A illustrates a simple substrate design, according to some embodiment of the present disclosure. Two FTO substrates (using, in this example, "TEC 15" FTO coated glass plates) were patterned via laser scribing, one coated with $NiO_x$ and perovskite, the other coated with $SnO_x$ and coated with perovskite, and the resultant two partial stacks were combined together resulting in semi-transparent perovskite-containing full stack PV devices having surface areas of about ~25 mm$^2$, with a ~800 nm thick MAPI active layer. The average full stack device demonstrated a power conversion efficiency (PCE) of 9.6%, open-circuit voltage ($V_{oc}$) of 950 mV, short-circuit current density ($J_{sc}$) of 20.2 mA/cm$^2$, fill factor (FF) of 50.0%, shunt resistance ($R_{sh}$) of 1044Ω, and series resistance ($R_s$) of 59Ω. The J-V for the best performing full stack perovskite PV device J-V curve is shown in FIG. 7B. The performance metrics for the best performing device having this full stack design was a power conversion efficiency (PCE) of 10.6%, open-circuit voltage ($V_{oc}$) of 951 mV, short-circuit current density ($J_{sc}$) of 22.3 mA/cm$^2$, fill factor (FF) of 50.1%, shunt resistance ($R_{sh}$) of 1130Ω, and series resistance ($R_s$) of 69.1Ω.

The present disclosure relates to a method that may utilize a combination of pressure and heat to bond two perovskite thin films together. Perovskite PV devices made using some of the methods described herein, performed at reasonable efficiencies in the perovskite PV device architecture implemented here, and the absorbance, EQE, XRD, and TRPL results indicate slight improvements in the properties of the full stack perovskite active layers (the two device halves), even when compared to samples prepared with additional thermal input at 100° C. As noted above, the improvements seen in the combining of a first partial stack with a second partial stack appear to be at least partially due to the prevention or slowing of the thermal decay pathway described by Equation 1, allowing the thermal budget to be increased without inducing degradation. This decoupling of the positive effects of annealing from the negative byproduct of thermally induced degradation is not achievable in standard processing of devices containing MA-based perovskites because temperatures sufficient for grain growth are also adequate to induce thermal degradation, forming $PbI_2$ and organic gases that off-gas to allow degradation to proceed (see Equation 1). Although many mechanisms may reasonably explain the improved properties of laminated samples, and without wishing to be bound by theory, it seems likely that the additional thermal input provided in the combining step is sufficient to (a) cause the mobile A- and X-site ions of the $ABX_3$ perovskite structure to inter-diffuse, improving the stoichiometry within the grain by moving impurities to the grain boundaries, and (b) to partially thermally decompose the perovskite through an reaction similar to Equation 1, volatilizing and trapping in gasses capable of partially solvating the perovskite between the two impermeable glass slides. These organic gases then mediate the bonding of any AX and $BX_2$ impurities at the grain boundaries, growing grains and improving uniformity.

The method described in the present disclosure is supported by the XRD results. Specifically, the thermal load provided by an approximately 20-minute anneal at approximately 150° C. should be sufficient to thermally decompose the perovskite and thus generate large amounts of $PbI_2$, but in the self-encapsulated format of lamination instead appears to improve crystallinity without any detectable increase in $PbI_2$. In order to further probe this, two partial stacks were laminated together inside a butyl-rubber barrier at approximately 300 psi and approximately 150° C. on the hot press for 5 days. This level of stressing far exceeds those for which typical devices based on these materials can withstand do elimination of mass transport out of the system. While the edges of the substrate showed visible signs of thermal degradation, the interior, where gases cannot escape, remained uniform and black rather than turning yellow, indicating no significant decomposition to $PbI_2$. This suggests that the bulk of the MAPI material is intrinsically stable and may require off-gassing for typical thermal degradation pathways (e.g. Equation 1) to proceed.

As shown above, the methods described herein improve the electronic structure, reduces the number of defects, increases the crystallinity, and enhances the photophysical properties of the resultant perovskite layer. In addition to affording these improvements, the methods demonstrated herein are attractive for enabling the integration of two completely new sets of devices: (1) final perovskite PV devices less sensitive to the typical thermal budgeting and solvent compatibility constraints and (2) final perovskite PV devices which utilize two different initial perovskite devices [e.g. MAPI and $CH_3NH_3PbBr_3$ or $CH(NH_2)_2PbI_3$] to form a perovskite-perovskite heterojunction and/or graded band gap. The former was demonstrated here to fabricate semi-transparent devices employing two high-temperature oxide transport layers, $SnO_x$ and $NiO_x$, which yielded an average efficiency of 9.6% and a maximum efficiency of 10.6% despite series resistance limitations from the substrate design and the perovskite PV device structure.

Moreover, the methods described in the present disclosure may create a self-encapsulated module architecture because the two impermeable glass substrates provide barriers that exclude extrinsic chemical species known to degrade the cell and trap in components that, if off-gassed, may result in perovskite decomposition. The method described herein may be employed to provide insight into the degradation of halide perovskite solar cells. This is particularly true for interfaces, as the independent processing of the two starting devices allows for each perovskite/charge transport material interface to be manipulated and analyzed independently prior to the formation of the complete solar cell. Combined with new-found access to device material combinations, this should allow for further investigation in areas such as the effect of alternate interfaces and transport materials and the discrepancy in efficiency between n-i-p and p-i-n architectures. Consequently, the method described in the present disclosure provides a viable route moving forward to curtail solvent incompatibility and thermal budgeting issues, and as such provides new opportunities for device improvements in conventional or semi-transparent configurations of interest in tandems.

Figure 12:
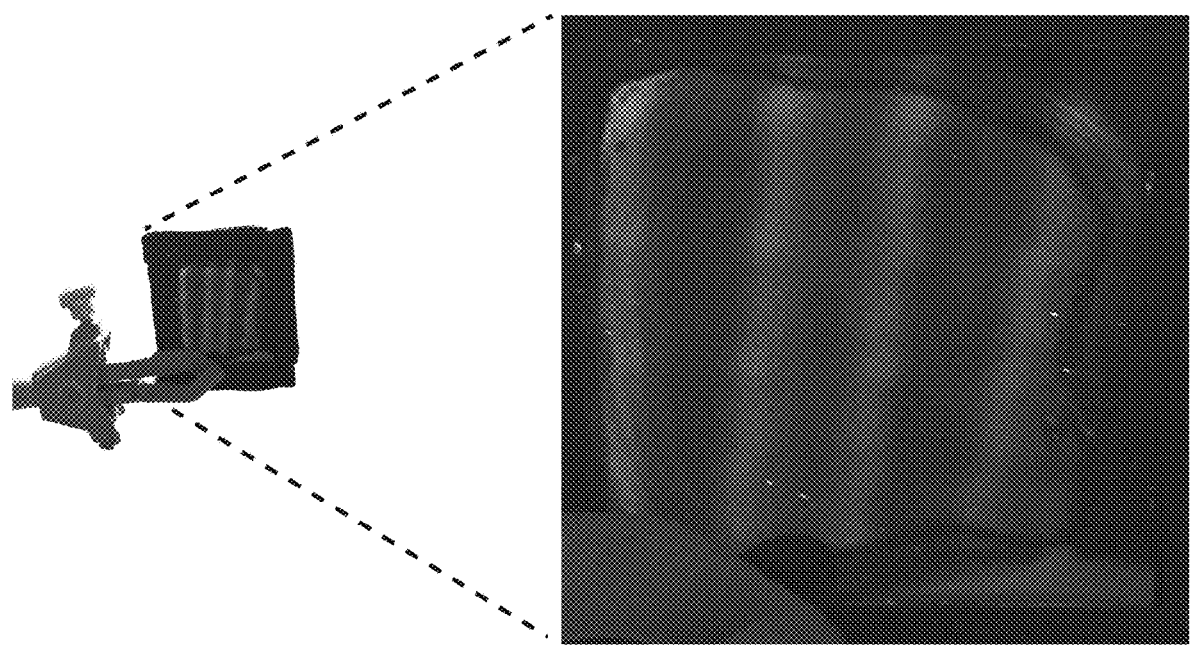
FIG. 12 illustrates degradation data for a device constructed using methods described herein, according to some embodiments of the present disclosure.

FIG. 12 illustrates photos resulting from an extended degradation test. The photos illustrate a device fabricated according to some of the methods described herein after 5 days exposure to 150° C. at 200 psig. Note the lack of degradation in the center of the device where gasses volatilized cannot escape. The lines in the picture are from the background tube lighting. The lamination process creates a perovskite device with improved stability.

Combining of perovskite materials beyond lead-containing perovskites is within the scope of the present disclosure. For example, the methods described herein may be utilized to combine tin or tin/lead mixed perovskites such as but not limited to $FASnI_3$, $FA_{0.6}MA_{0.4}Sn_{0.6}Pb_{0.4}I_3$, $FA_{0.75}Cs_{0.25}Sn_{0.40}Pb_{0.60}I_3$, $FA_{0.75}Cs_{0.25}Sn_{0.60}Pb_{0.40}I_3$. Bismuth-containing perovskites may also be combined using the methods described herein. Similarly, the present method is not limited to just iodine as the X-anion. Other perovskite materials may be combined using at least one or more perovskite materials that include on or more other halogens or pseudo-halogens, for example, at least one of bromine, chlorine, and/or $SCN^-$.

In some embodiments of the present disclosure, the combining of a first partial stack with a second partial stack may be achieved using a temperature gradient across the forming full stack during the combining step. For example, the press used to combine the partial stacks may have a first hot surface in contact with the first partial stack and a second hot surface in contact with the second partial stack. During the combining of the two partial stacks, the first hot surface may be maintained at a first temperature, and the second hot surface at a different second temperature. Since mass transfer (diffusion) varies with temperature, controlling the two hot surfaces at different temperatures may result in different mass transfer rates of the partial stack components (A-cation, B-cation, and X-cation) into/through the resulting full stack. In some embodiments of the present disclosure, the first and second temperatures may be between 0° C. and 500° C.

The methods described herein may also be utilized to produce a full stack by combining a first partial stack having at least one precursor for producing a perovskite material (e.g. $PbI_2$) with a second partial stack having at least one additional precursor (e.g. MAI). The combining of the two partial stacks may then result in, due to at least one of temperature, time at temperature, and/or pressure, the formation of a crystalline perovskite active layer. In some embodiments, a method may combine a partial stack that includes a perovskite layer with a second partial stack that includes an additive; for example, another halogen-containing precursor to produce a mixed-halide perovskite from a starting mono-halide perovskite. Another example of an additive includes 1D and 2D additive to affect things like interfacial properties of the resultant combined perovskite layer. Reactants and/or additives may be applied to a partial stack in either solid and/or liquid form.

In some embodiments of the present disclosure, a first partial stack having a wide bandgap perovskite layer and a second partial stack having a low bandgap perovskite layer may be combined to form a full stack device, having a final perovskite layer with a gradient bandgap across the length of the combined perovskite layer. A low bandgap may be between 0.5 eV and 1.3 eV, or between 0.9 eV and 1.3 eV. A high bandgap may be between greater than 1.3 eV and 5.0 eV, or between 1.6 eV and 1.9 eV. This could be facilitated by using a combination of 3D and/or 2D and/or 1D perovskites to both facilitate the bandgap gradient and the self-assembly of electron and hole selective regions within the resultant perovskite absorber layer, eliminating the need for discreet HTM/ETM layers.

In some embodiments of the present disclosure, for light emitting applications, the inclusion of low dimension (e.g. 2D and/or 1D) low gap perovskite-based quantum wells may be introduced as a thin (e.g. less than or equal to 25 nm) top layer on at least one of the original substrates of the two or more partial stacks. Subsequent combining of the partial stacks may then facilitate improved charge transfer resulting from composition and/or bandgap gradients formed in the resultant final perovskite layer by the combining step itself.

The methods described herein may also enable the use in partial stacks of inorganic oxide perovskites (e.g. $BaSrTiO_3$) and/or non-perovskite materials such as at least one of PbSe, PbS, and/or other materials which have shown compatibility with halide-containing perovskite systems to produce full stacks, e.g. solar cells, LEDs, and/or lasers, having at least one of a unique device stack architecture and/or unique material combinations, and/or improved physical and/or performance properties. In this case, complex high thermal budget components such as dielectric high reflectivity mirrors, in the case of lasers, may be placed on both substrates to realize a high quality optical cavity to reduce laser threshold and improve optical and electrical efficiency without damage to the active laser medium (e.g. the halide perovskite, or perovskite composite (e.g. PbSe quantum dot and/or other quantum dots/perovskite or 2D-perovksite/3D-perovskite systems)).

EXPERIMENTAL

Chemicals:
MAI was purchased from Dyesol. $PbI_2$ (99.9985%) and $SnO_2$ (15% in $H_2O$ colloidal dispersion) were purchased from Alfa Aesar. All other chemicals and solvents were obtained from Sigma-Aldrich and used as received.

Figure 8:
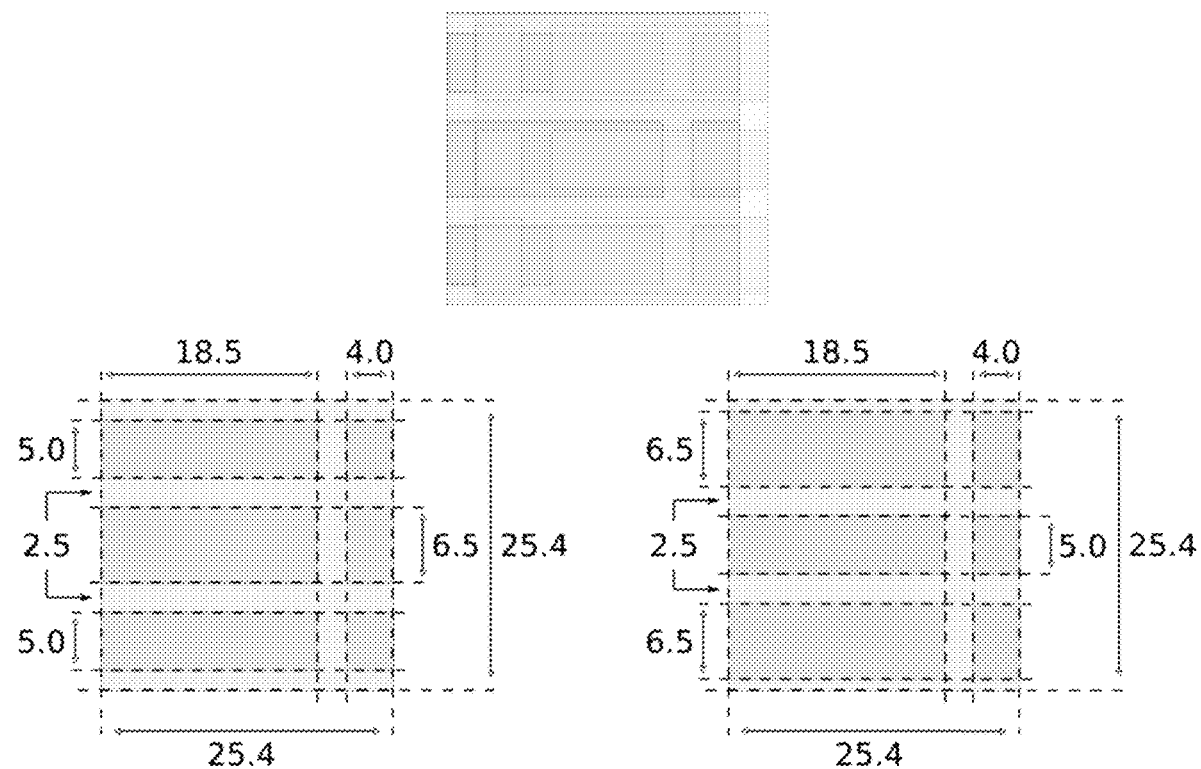
FIG. 8 illustrates substrate design (top) and corresponding TCO current collecting layer patterns (bottom) utilized for perovskite-containing devices, according to some embodiments of the present disclosure.

Substrate Preparation:
Full FTO TEC 15 sheets were ordered from Hartford Glass Co. and cut down to 1×1 in using a diamond scribe. The substrates were then pattered film-side-up as shown in FIG. 8 with a Q-switched 532 nm $Nd:YVO_4$ laser scriber at 100 mm/s utilizing a 40 µm beam diameter, 30 A of current, and a 0.02 mm beam overlap. Once etched, the substrates were immediately cleaned with lint free clean room wipes and set aside until needed. Prior to deposition, the substrates were sonicated in acetone, isopropanol alcohol, and deionized water for 15 min each, and then UV-ozone treated for 15 min.

Nickel Oxide ($NiO_x$):
Nickel oxide films were created following a procedure modified from one described by You (*Nat. Nanotechnol.* 2016, 11 (1), 75-81). The recipe utilized here differs in its use of an intermediate cooling step to reduce the dispersity of nanoparticles and shorter spin time to minimize differences seen from the first to last sample due to the two-part annealing utilized. First, nickel nitrate hexahydrate ($Ni(NO_3)_2 \cdot 6H_2O$) was fully dissolved in ethylene glycol to form a 1 M solution. The solution was then placed in a freezer. Roughly 30 min before deposition, the green colored solution was removed from the freezer, 1 M of ethylenediamine was added, and the vial was quickly agitated by vortex causing the solution to turn dark blue. The solution was then sonicated for 5 min, deposited through a 0.2 um PTFE filter, and spun coat at 5000 rpm for 45 secs with a ramp time of 1 sec. Samples were then placed on a hotplate at 100° C. and when all samples were on the hotplate, the hotplate was ramped to 300° C., where it was kept for an hour. Once fully annealed, the samples were removed and loaded into a glovebox as quickly as possible for perovskite deposition.

Tin Oxide ($SnO_x$):

Tin oxide films were fabricated following a procedure reported by Jiang (*Nat. Energy* 2016, 2 (1), 16177). Briefly, $SnO_2$ (15% in $H_2O$ colloidal dispersion) was diluted to 2.67% using deionized water and then sonicated for 10 min in cold water. Soon after, the solution was spun cast onto the substrates at 3000 rpm for 30 secs with a 1 sec ramp rate. A PTFE filter was not used because the alkaline nature of the solution degrades PTFE. The cast films were then annealed on a hot plate for 30 min at 150° C. in air and then cleaned by UV-ozone treatment for 15 min immediately before perovskite film deposition.

Methylammonium Lead Iodide Perovskite (MAPI):

Perovskite films were created based on a procedure reported by Noel (*Energy Environ. Sci.* 2017, 10 (1), 145-152). Because the thickness of the perovskite layer doubles in lamination, slightly different molarities and solvent ratios were utilized to obtain thinner films. In short, a 25% methylamine (MA) in acetonitrile (ACN) stock solution was prepared by slowly condensing pure MA into a round bottom flask of ACN at −15° C. To prevent degradation, this stock solution was kept in a freezer at −5° C. until use. MAI and $PbI_2$ were then weighed out in a 1.00:1.04 mole ratio. Next, pure anhydrous ACN and stock MA in ACN were added to the perovskite precursors in a 7:9 volume ratio to obtain a 0.5 M solution. This solution was then deposited onto substrates through a 0.2 um PTFE filter and spun coat at 2500 rpm for 30 secs with a ramp time of 1 sec. Finally, coated films were annealed at 100° C. for 20 min to allow drying. All solution synthesis was done in air, while all deposition and annealing occurred in an Argon glovebox.

Figure 9:
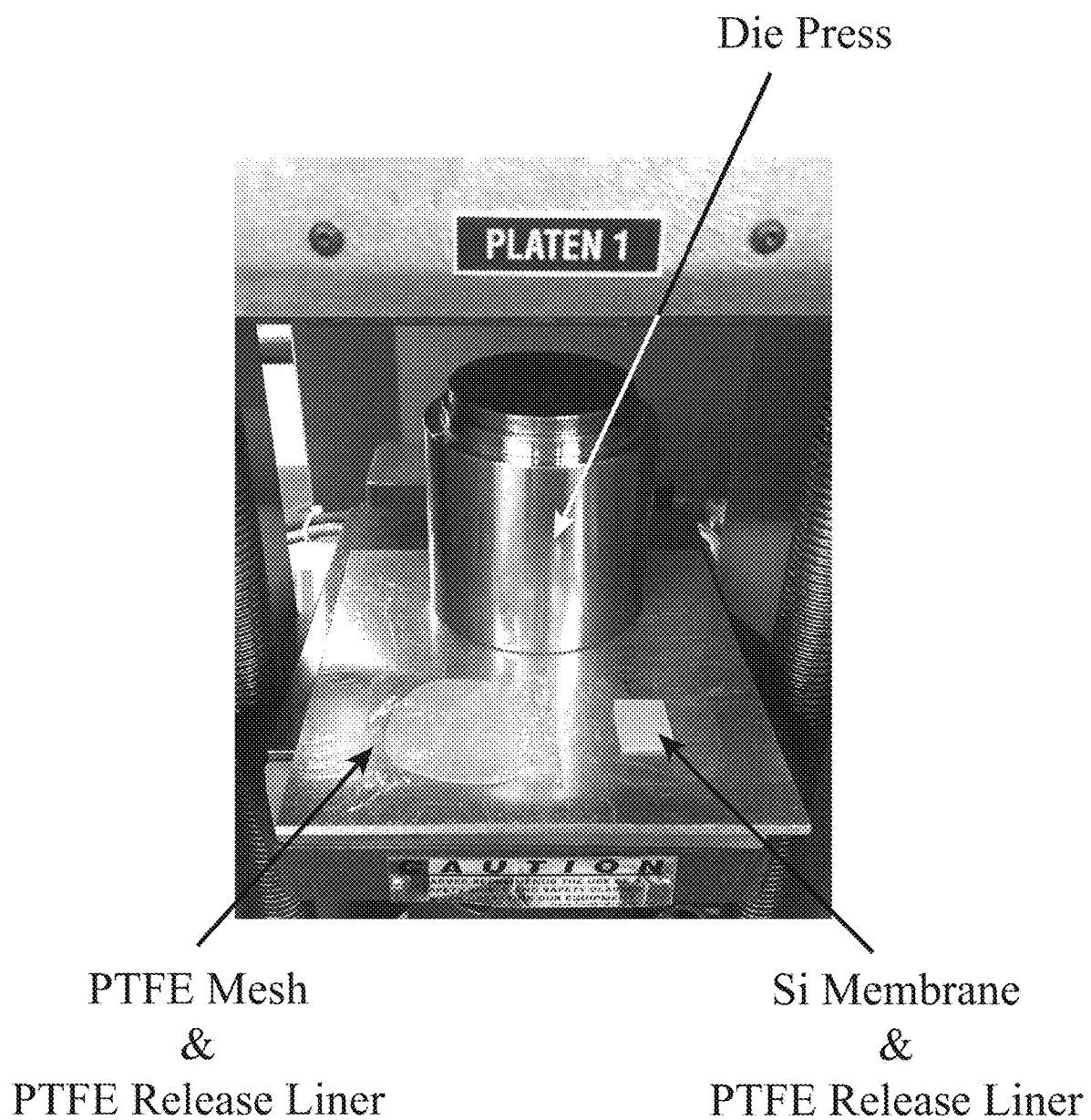
FIG. 9 illustrates a Carver hot press, die press, PTFE mesh, PTFE release liner, and silicon membrane utilized to apply uniform pressure and heat during the combining of at least two partial stacks to produce a full stack device, according to some embodiments of the present disclosure.

Lamination/Delamination Procedure:

A first glass/FTO/$SnO_x$/perovskite device and glass/FTO/$NiO_x$/perovskite device were sandwiched Perovskite-to-Perovskite between two PTFE release liners and on top of a PTFE mesh (see FIG. 9). A deformable silicon membrane was then cut to size and placed above the release liner where the two half devices overlap. The silicon membrane/PTFE release liner/top device/bottom device/PTFE release liner/PTFE mesh device was then placed between two more release liners and underneath a die press in a carver hydraulic hot press at ~300 psi and 150° C. for 20 min. Note that the natural compression/elasticity of the pads causes pressure to naturally decreases over the lamination duration. To ensure that pressure remained uniform for the initial 5 min, pressure was slowly applied to match any drops in pressure. Once the allotted time was complete, pressure was released over the course of ~2 min before the device membrane sandwich was removed. Finally, after allowing the device to cool for another minute, the release liners, PTFE mesh, and silicone membrane were detached to yield the final device. This procedure produced optimal pressure uniformity. Subsequent delamination at the $SnO_x$/MAPI interface was achieved by forcibly twisting each overhanging edge in the opposite direction.

UV-Vis Absorption:

Transmission and Reflection Spectra were obtained using an integrating sphere in a Shimatzu UV-3600 UV-Vis-near-infared spectrophotometer. Absorption was calculated by assuming Absorptance=1−Transmittance−Reflectance. The contribution of each Glass/FTO/transportation material layer was then subtracted out and values were converted to absorbance. The correction for the back substrate of the laminated perovskite PV device was taken film-first in an attempt to accurately mimic the path of light, although using data from the other face of the film yields qualitatively identical conclusions. To compare the curves, spectra were normalized at 725 and 825 nm. This was done by performing baseline subtraction at 825 nm, where the perovskite does not absorb, and then normalizing spectra to 1 at 725 nm, away from the band edge of the perovskite, using scalar multiplication.

External Quantum Efficiency (EQE):

To compare the external quantum efficiencies, two complete perovskite PV devices were required. The laminated perovskite PV device was produced as described above. The FTO/$SnO_x$/MAPI/spiro-OMeTAD/$MoO_x$/Al device was fabricated by completing a FTO/$SnO_x$/MAPI device with spiro and $MoO_x$/Al as reported by Dou (*J. Phys. Chem. Lett.* 2017, 8 (19), 4960-4966). In short, a spiro-OMeTAD solution containing 72 mg/mL spiro-OMeTAD, 0.028 mL/mL 4-tert-butylpyridine, and 0.017 mL of a 520 mg/mL bis(trifluoromethanesulfonyl)imide lithium salt (Li-TFSI) in ACN solution was deposited onto the two devices at 3000 rpm for 30 sec with a ramp rate of 1 sec. The films were then left to dry and oxidize overnight before 15 nm of $MoO_x$ and 150 nm of Al were thermally evaporated at 0.1 nm/s and 1 nm/s respectively to finish the device. Both perovskite PV devices were analyzed using an Oriel IQE 200 system. Due to the active area being a similar size to the spot size, several measurements were conducted, and the highest performing curve was used for analysis to ensure proper alignment. To compare the curves, spectra were again normalized at 825 and 725 nm as done for absorption measurements; specifically, baseline subtraction was performed at 825 nm (where the perovskite does not absorb) and then spectra were normalized at 725 nm (away from the band edge of the perovskite) using scalar multiplication.

X-Ray Diffraction (XRD):

XRD data were recorded on a Bruker D8 Discover X-ray diffractometer with a Hi-Star 2D area detector using Cu Kα radiation (1.54 Å). Samples were scanned for 30 min with an x-y raster of 5 mm. To obtain the 2-D graphs displayed, 3-D images were integrated along phi. To compare the curves, spectra were normalized. This was done by performing baseline subtraction and then normalizing the spectras' highest peak to 1 using scalar multiplication.

Figure 10:
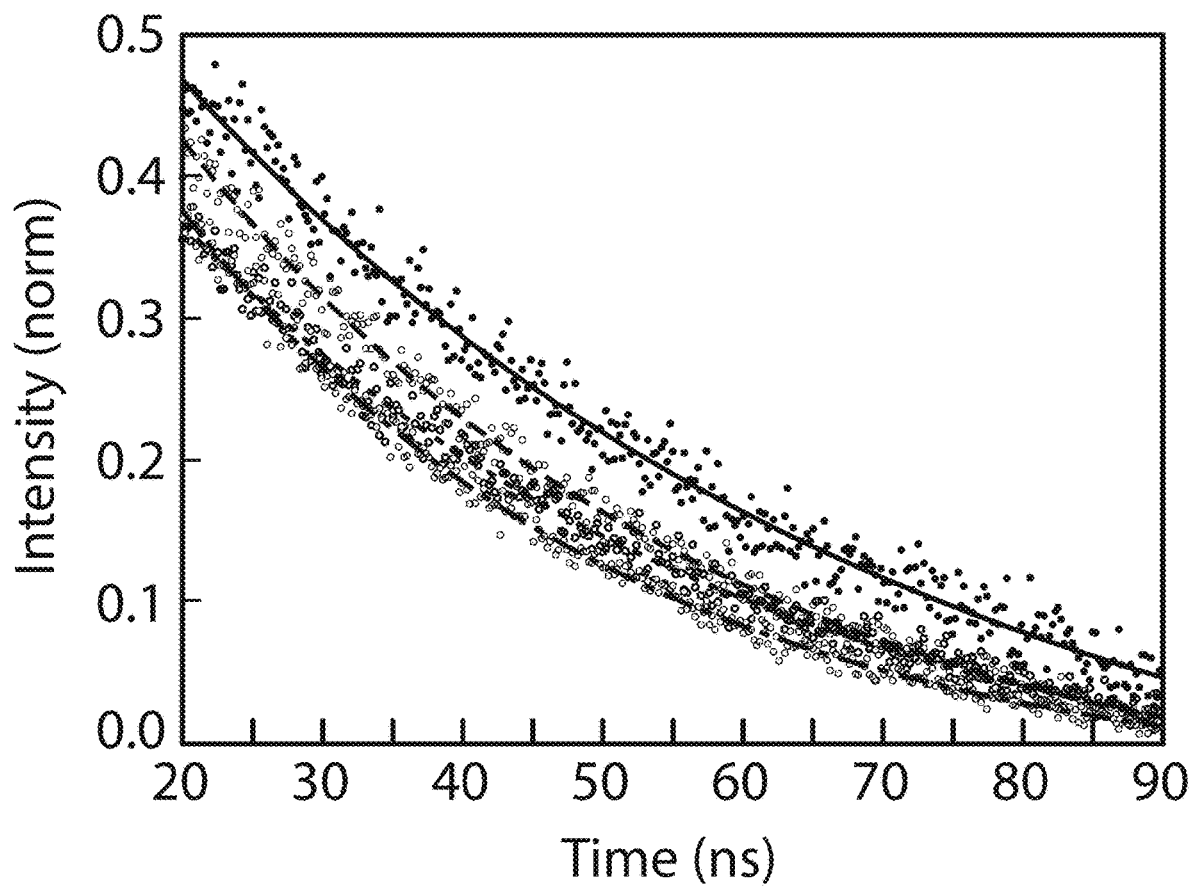
FIG. 10 illustrates time resolved photo luminescence data and corresponding single exponential fits for perovskite-containing devices made according to methods described herein, according to some embodiments of the present disclosure.
Figure 11:
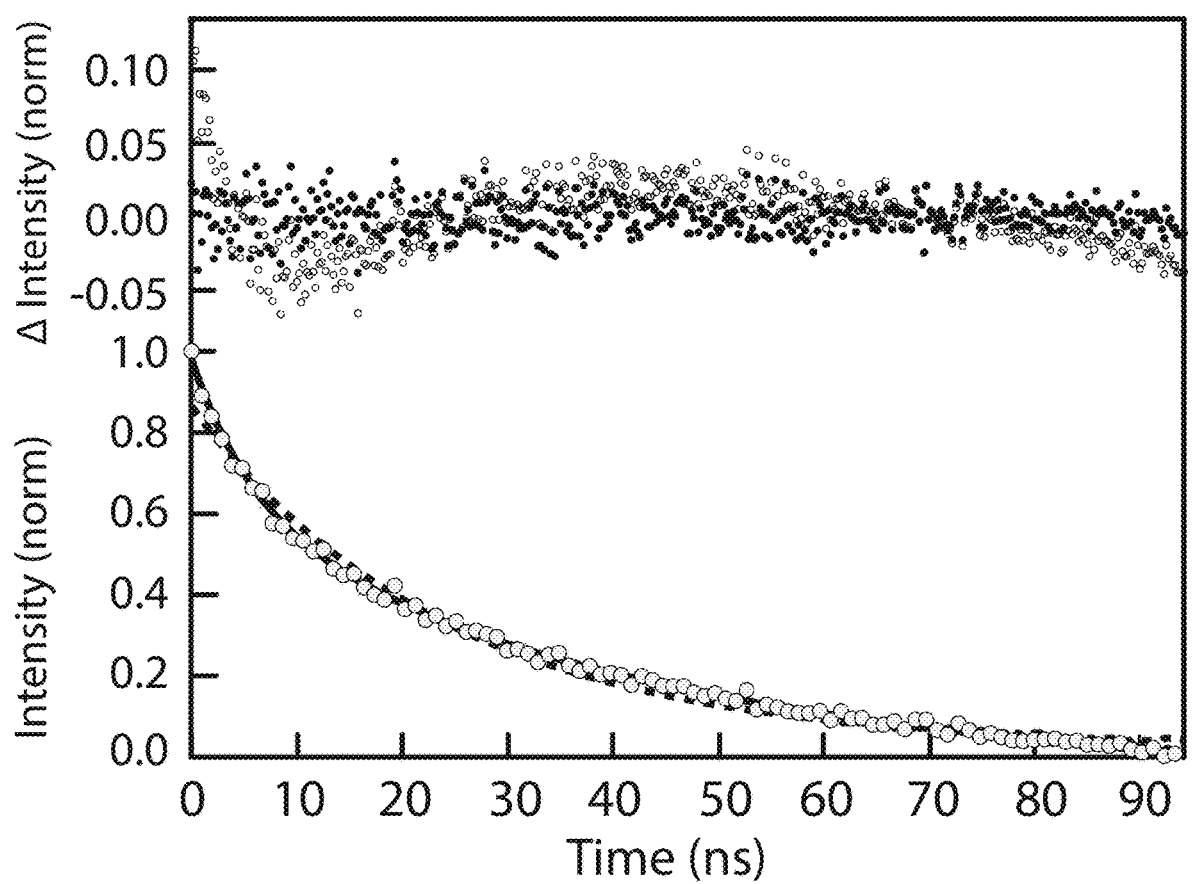
FIG. 11 illustrates time Resolved photo luminescence data and corresponding residuals for single exponential and double exponential fits for devices constructed using methods described herein, according to some embodiments of the present disclosure.

Time-Resolved Photoluminescence:

Time-resolved photoluminescence spectroscopy measurements were performed using the time-correlated single photon counting technique. Excitation light was generated by a Fianium SC-450-PP laser operating with an average power of 15.5 μW at a repetition rate of 10 MHz and a wavelength of 450 nm selected by a Fianium AOTF system. A 470 nm long pass filter was used to remove scattering from the excitation source. The emission was detected using a Hamamatsu streak camera with a wavelength range of 200-900 nm and response of <20 ps. All samples were positioned with the glass side facing the incident excitation light. To compare traces, data was shifted and normalized so that maximal values of 1 occurred at time of 0 ns. Baselines were then subtracted, and data was truncated to eliminate the intensity dependent region of the graph at times less than 20 ns. FIG. 10 shows data and corresponding single exponential fits. The data set indicated by the solid line and solid, black filled circles corresponds to the full stack device; the data set indicated by the short-dashed line and bolded outlined, empty circles corresponds to the separated partial stack; the data set indicated by the long-dashed line, and light outlined empty circles corresponds to a partial stack heated at 100° C. for 20 minutes; and the data set indicated by the short-long-dashed line and the lightly filled circles corresponds to a partial stack heated at 100° C. for 40 minutes. FIG. 11 shows a residual comparison between a single exponential (dashed line in FIG. 11) and double exponential best fit (solid line in FIG. 11) using data from the delaminated sample. The data shown in FIGS. 10 and 11 were collected for partial stacks constructed only of glass/MAPI to form full stacks having a glass/MAPI/MAPI/glass architecture.

First Set of Examples

Example 1

A method comprising: depositing a first cation (A), a second cation (B), and an anion (X) onto at least one of a first surface or a second surface, resulting in at least one layer comprising at least one of A, B, or X; and combining the first surface with the second surface such that the at least one layer is positioned between the first surface and the second surface, wherein: during at least a portion of the combining, applying at least one of heat or pressure to at least one of the first surface or the second surface resulting in at least one of the heating of the layer or the pressurizing of the layer, during the combining, substantially all of A, B, and X remain between the first surface and the second surface, and the combining results in the transforming of the layer to a perovskite comprising $ABX_3$.

Example 2

The method of Example 1, wherein A comprises a trivalent cation.

Example 3

The method of Example 1, wherein A comprises at least one of an organic cation or an inorganic cation.

Example 4

The method of Example 3, wherein the organic cation comprises an alkyl ammonium cation.

Example 5

The method of Example 3, wherein the organic cation comprises at least one of methylammonium (MA), ethylammonium, propylammonium, butylammonium, formamidinium (FA), guanidinium (GA), dimethylammonium (DMA), or acetamidinium (AC).

Example 6

The method of Example 3, wherein the inorganic cation comprises at least one of cesium or rubidium.

Example 7

The method of Example 1, wherein B comprises at least one of a monovalent cation or a multivalent cation.

Example 8

The method of Example 1, wherein B comprises at least one of lead, tin, germanium, silver, bismuth, titanium, indium, gallium, copper, silver, gold, rhodium, or antimony.

Example 9

The method of Example 1, wherein X comprises at least one of a halide or a pseudohalide.

Example 10

The method of Example 9, wherein the halide comprises at least one of iodide, chloride, or bromide.

Example 11

The method of Example 9, wherein the pseudohalide comprises at least one of cyanate, isocyanate, fulminate, thiocyanate, isothiocyanate, or hypothiocyanite.

Example 12

The method of Example 1, wherein, during the depositing, at least one of A, B, or X is in the form of a salt.

Example 13

The method of Example 12, wherein the salt comprises a perovskite precursor of at least one of MABr, MACl, FAI, FABr, FACl, GAI, GABr, GACl, CsI, CsBr, CsCl, $PbI_2$, $SnI_2$, or $BiI_3$.

Example 14

The method of Example 1, wherein, during the depositing, at least one of A, B, or X is at least partially a solid such that the at least one layer comprises the solid.

Example 15

The method of Example 14, wherein: the solid is a powder, and the combining removes substantially all gas contained in the powder.

Example 16

The method of Example 1, wherein, during the depositing, at least one of A, B, or X is at least partially dissolved in a solution comprising a solvent such that the at least one layer comprises a liquid film of the solution.

Example 17

The method of Example 16, wherein the solvent comprises a polar solvent.

Example 18

The method of Example 17, wherein the polar solvent comprises at least one of dimethylformamide or dimethyl sulfoxide.

Example 19

The method of Example 16, further comprising, prior to the combining, removing the solvent resulting in the transforming of the liquid film to a solid layer such that the at least one layer comprises the solid layer.

Example 20

The method of Example 19, wherein the solid layer comprises a crystal of a perovskite precursor.

Example 21

The method of Example of 20, wherein the perovskite precursor comprises at least one of MABr, MACl, FAI, FABr, FACl, GAI, GABr, GACl, CsI, CsBr, CsCl, $PbI_2$, $SnI_2$, or $BiI_3$.

Example 22

The method of Example 19, wherein the solid layer comprises the perovskite.

Example 23

The method of Example 1, wherein, during the combining, the heating of the layer is to a temperature between 0° C. and 500° C.

Example 24

The method of Example 1, wherein, during the combining, the pressurizing of the layer is to a pressure between one atmosphere and 100 atmospheres.

Example 25

The method of Example 1, wherein the combining is performed for a period of time between five seconds and 24 hours.

Example 26

The method of Example 1, wherein the perovskite comprises at least one of $MAPbI_3$, $MAPbBr_3$, $CsPbI_3$, $CsPbBr_3$, MAFACsPbIBr.

Example 27

The method of Example 26, wherein the MAFACsPbIBr comprises about $Cs_{0.05}(MA_{0.17}FA_{0.83})_{0.95}Pb(I_{0.83}Br_{0.17})_3$.

Example 28

The method of Example 26, wherein the perovskite comprises $MAPb(I_xBr_{1-x})_3$, where $0 \leq x \leq 1$.

Example 29

The method of Example 1, wherein at least one of the first surface or the second surface is an outer surface of at least one of a charge transport layer or a current collecting layer.

Example 30

The method of Example 29, wherein the charge transport layer is a hole transport layer (HTL).

Example 31

The method of Example 30, wherein the HTL comprises a metal oxide.

Example 32

The method of Example 31, wherein the metal oxide comprises at least one of nickel oxide, copper chromium iodide, or copper iodide.

Example 33

The method of Example 29, wherein the charge transport layer is an electron transport layer (ETL).

Example 34

The method of Example 33, wherein the ETL comprises a metal oxide.

Example 35

The method of Example 34, wherein the metal oxide comprises at least one of tungsten oxide, tin oxide, titanium oxide, or vanadium oxide.

Example 36

The method of Example 29, wherein the current collecting layer comprises at least one of an oxide or a metal.

Example 37

The method of Example 36, wherein the oxide is transparent.

Example 38

The method of Example 36, wherein the oxide comprises at least one of fluorine-doped tin oxide, indium-doped tin oxide, indium-doped zinc oxide, or aluminum-doped zinc oxide.

Example 39

The method of Example 36, wherein the metal comprises at least one of silver, gold, aluminum, or molybdenum.

Example 40

The method of Example 29, wherein the at least one charge transport layer or current collecting layer further comprises an inner surface that is in thermal contact with a surface of a device that applies the heat or the pressure.

Example 41

The method of Example 40, wherein the device is a press.

Example 42

The method of Example 40, wherein the device provides the heat using at least one of a resistance heater, an inductive heater, or a heat transfer fluid.

Example 43

The method of Example 40, wherein the device provides the pressure mechanically or pneumatically.

Second Set of Examples

Example 1

A method comprising: a first depositing of at least one of a first cation (A), a second cation (B), or a first anion (X) onto a first surface, resulting in the forming of a first layer comprising at least one of A, B, or X; a second depositing of at least one of a third cation (A'), a fourth cation (B'), and a second anion (X') onto a second surface, resulting in the forming of a second layer comprising at least one of A', B', or X'; and combining the first surface with the second surface such that the first layer and the second layer are in physical contact with each other and the first layer and the second layer are positioned between the first surface and the second surface, wherein: during at least a portion of the combining, applying at least one of heat or pressure to at least one of the first surface or the second surface resulting in at least one of the heating of the first layer and second layer or the pressurizing of the first layer and the second layer, during the combining, substantially all of A, B, and X remain between the first surface and the second surface, during the combining, substantially all of A', B', and X' remain between the first surface and the second surface, the combining results in the transforming of the first layer and the second layer to a layer of a perovskite comprising $A_{1-x}A'_xB_{1-y}B'_y(X_{1-z}X'_z)_3$, and $0 \le x \le 1$, $0 \le y \le 1$, and $0 \le z \le 1$.

Example 2

The method of Example 1, wherein A comprises a trivalent cation.

Example 3

The method of Example 1, wherein A comprises at least one of an organic cation or an inorganic cation.

Example 4

The method of Example 3, wherein the organic cation comprises an alkyl ammonium cation.

Example 5

The method of Example 3, wherein the organic cation comprises at least one of methylammonium (MA), ethylammonium, propylammonium, butylammonium, formamidinium (FA), guanidinium (GA), dimethylammonium (DMA), or acetamidinium (AC).

Example 6

The method of Example 3, wherein the inorganic cation comprises at least one of cesium or rubidium.

Example 7

The method of Example 1, wherein B comprises at least one of a monovalent cation or a multivalent cation.

Example 8

The method of Example 1, wherein B comprises at least one of lead, tin, germanium, silver, bismuth, titanium, indium, gallium, copper, silver, gold, rhodium, or antimony

Example 9

The method of Example 1, wherein X comprises at least one of a halide or a pseudohalide.

Example 10

The method of Example 9, wherein the halide comprises at least one of iodide, chloride, or bromide.

Example 11

The method of Example 9, wherein the pseudohalide comprises at least one of cyanate, isocyanate, fulminate, thiocyanate, isothiocyanate, or hypothiocyanite.

Example 12

The method of Example 1, wherein A' comprises a trivalent cation.

Example 13

The method of Example 1, wherein A' comprises at least one of an organic cation or an inorganic cation.

Example 14

The method of Example 13, wherein the organic cation comprises an alkyl ammonium cation.

Example 15

The method of Example 13, wherein the organic cation comprises at least one of methylammonium (MA), ethylammonium, propylammonium, butylammonium, formamidinium (FA), guanidinium (GA), dimethylammonium (DMA), or acetamidinium (AC).

Example 16

The method of Example 13, wherein the inorganic cation comprises at least one of cesium or rubidium.

Example 17

The method of Example 1, wherein B' comprises at least one of a monovalent cation or a multivalent cation.

Example 18

The method of Example 1, wherein B' comprises at least one of lead, tin, germanium, silver, bismuth, titanium, indium, gallium, copper, silver, gold, rhodium, or antimony

Example 19

The method of Example 1, wherein X' comprises at least one of a halide or a pseudohalide.

Example 20

The method of Example 19, wherein the halide comprises at least one of iodide, chloride, or bromide.

Example 21

The method of Example 19, wherein the pseudohalide comprises at least one of cyanate, isocyanate, fulminate, thiocyanate, isothiocyanate, or hypothiocyanite.

Example 22

The method of Example 1, wherein A and A' are the same.

Example 23

The method of Example 1, wherein A and A' are different.

Example 24

The method of Example 1, wherein B and B' are the same.

Example 25

The method of Example 1, wherein B and B' are different.

Example 26

The method of Example 1, wherein X and X' are the same.

Example 27

The method of Example 1, wherein X and X' are different.

Example 28

The method of Example 1, wherein, during the depositing, at least one of A, B, X, A', B', or X' is in the form of a salt.

Example 29

The method of Example 28, wherein the salt comprises a perovskite precursor of at least one of MABr, MACl, FAI, FABr, FACl, GAI, GABr, GACl, CsI, CsBr, CsCl, $PbI_2$, $SnI_2$, or $BiI_3$.

Example 30

The method of Example 1, wherein, during the depositing, at least one of A, B, X, A', B', or X' is at least partially a solid such that the at least one layer comprises the solid.

Example 31

The method of Example 30, wherein: the solid is a powder, and the combining removes substantially all gas contained in the powder.

Example 32

The method of Example 1, wherein, during the depositing, at least one of A, B, X, A', B', or X' is at least partially dissolved in a solution comprising a solvent such that the at least of the first layer or the second layer comprises a liquid film of the solution.

Example 33

The method of Example 32, wherein the solvent comprises a polar solvent.

Example 34

The method of Example 33, wherein the polar solvent comprises at least one of dimethylformamide or dimethyl sulfoxide.

Example 35

The method of Example 32, further comprising, prior to the combining, removing the solvent resulting in the transforming of the at least one liquid film to at least one solid layer such that the at least one layer comprises the at least one solid layer.

Example 36

The method of Example 35, wherein the at least one solid layer comprises a crystal of a perovskite precursor.

Example 37

The method of Example of 36 wherein the perovskite precursor comprises at least one of MABr, MACl, FAI, FABr, FACl, GAI, GABr, GACl, CsI, CsBr, CsCl, $PbI_2$, $SnI_2$, or $BiI_3$.

Example 38

The method of Example 35, wherein the solid layer comprises the perovskite.

Example 39

The method of Example 1, wherein, during the combining, the heating of the first layer and the second layer is to a temperature between 0° C. and 500° C.

Example 40

The method of Example 1, wherein, during the combining, the pressurizing of the first layer and the second layer is to a pressure between one atmosphere and 100 atmospheres.

Example 41

The method of Example 1, wherein the combining is performed for a period of time between five seconds and 24 hours.

Example 42

The method of Example 1, wherein the perovskite comprises at least one of $MAPbI_3$, $MAPbBr_3$, $CsPbI_3$, $CsPbBr_3$, MAFACsPbIBr.

Example 43

The method of Example 42, wherein the MAFACsPbIBr comprises about $Cs_{0.05}(MA_{0.17}FA_{0.83})_{0.95}Pb(I_{0.83}Br_{0.17})_3$.

Example 44

The method of Example 42, wherein the perovskite comprises MAPb($I_x$Br$_{1-x}$)$_3$, where $0 \leq x \leq 1$.

Example 45

The method of Example 1, wherein the layer of the perovskite has a concentration gradient across the thickness of layer of at least one of A, B, X, A', B', or X'.

Example 46

The method of Example 45, wherein the concentration gradient is measurable by time-of-flight secondary ion mass spectrometry.

Example 47

The method of Example 1, wherein at least one of the first surface or the second surface is an outer surface of at least one of a charge transport layer or a current collecting layer.

Example 48

The method of Example 47, wherein the charge transport layer is a hole transport layer (HTL).

Example 49

The method of Example 48, wherein the HTL comprises a metal oxide.

Example 50

The method of Example 49, wherein the metal oxide comprises at least one of nickel oxide, copper chromium iodide, or copper iodide.

Example 51

The method of Example 47, wherein the charge transport layer is an electron transport layer (ETL).

Example 52

The method of Example 51, wherein the ETL comprises a metal oxide.

Example 53

The method of Example 52, wherein the metal oxide comprises at least one of tungsten oxide, tin oxide, titanium oxide, or vanadium oxide.

Example 54

The method of Example 47, wherein the current collecting layer comprises at least one of an oxide or a metal.

Example 55

The method of Example 54, wherein the oxide is transparent.

Example 56

The method of Example 55, wherein the oxide comprises at least one of fluorine-doped tin oxide, indium-doped tin oxide, indium-doped zinc oxide, or aluminum-doped zinc oxide.

Example 57

The method of Example 54, wherein the metal comprises at least one of silver, gold, aluminum, or molybdenum.

Example 58

The method of Example 47, wherein the at least one charge transport layer or current collecting layer further comprises an inner surface that is in thermal contact with a surface of a device that applies the heat or the pressure.

Example 59

The method of Example 58, wherein the device is a press.

Example 60

The method of Example 58, wherein the device provides the heat using at least one of a resistance heater, an inductive heater, or a heat transfer fluid.

Example 61

The method of Example 58, wherein the device provides the pressure mechanically or pneumatically.

Third Set of Examples

Example 1

A method comprising: positioning a stack comprising at least one of the following layers between a first surface and a second surface: a first perovskite layer; and a second perovskite layer; and treating the stack for a period of time by at least one of heating the stack or pressurizing the stack, wherein: a device comprising the first surface and the second surface provides the heating and the pressurizing of the stack, and the treating converts the first perovskite layer and the second perovskite layer to a third perovskite layer having at least one physical property or performance metric that is different than physical properties or performance metrics of the first perovskite layer and the second perovskite layer.

Example 2

The method of Example 1, further comprising a first charge transport layer positioned between the first surface and the first perovskite layer.

Example 3

The method of Example 2, further comprising a second charge transport layer positioned between the second surface and the second perovskite layer.

Example 4

The method of Example 3, further comprising a first current collecting layer positioned between the first surface and the first charge transport layer.

Example 5

The method of Example 4, further comprising a second current collecting layer positioned between the second surface and the second charge transport layer.

Example 6

The method of Example 5, further comprising a first substrate positioned between the first surface and the first current collecting layer.

Example 7

The method of Example 6, further comprising a first substrate positioned between the first surface and the first current collecting layer.

Example 8

The method of Example 1, wherein the heating is to a temperature between 0° C. and 500° C.

Example 9

The method of Example 1, wherein the pressurizing of the layer is to a pressure between one atmosphere and 100 atmospheres.

Example 10

The method of Example 1, wherein the period of time is between five seconds and 24 hours.

Fourth Set of Examples

Example 1

A device comprising: a perovskite layer having a thickness and comprising $A_{1-x}A'_xB_{1-y}B'_y(X_{1-z}X'_z)_3$, wherein: A comprises a first cation, B comprises a second cation, X comprises a first anion, A' comprises a third cation, B' comprises a fourth cation, and X' comprises a second anion, and the perovskite layer has a concentration gradient across its thickness of at least one of A, B, X, A', B', or X'.

Example 2

The device of Example 1, wherein A comprises a trivalent cation.

Example 3

The device of Example 1, wherein A comprises at least one of an organic cation or an inorganic cation.

Example 4

The device of Example 3, wherein the organic cation comprises an alkyl ammonium cation.

Example 5

The device of Example 3, wherein the organic cation comprises at least one of methylammonium (MA), ethylammonium, propylammonium, butylammonium, formamidinium (FA), guanidinium (GA), dimethylammonium (DMA), or acetamidinium (AC).

Example 6

The device of Example 3, wherein the inorganic cation comprises at least one of cesium or rubidium.

Example 7

The device of Example 1, wherein B comprises at least one of a monovalent cation or a multivalent cation.

Example 8

The device of Example 1, wherein B comprises at least one of lead, tin, germanium, silver, bismuth, titanium, indium, gallium, copper, silver, gold, rhodium, or antimony

Example 9

The device of Example 1, wherein X comprises at least one of a halide or a pseudohalide.

Example 10

The device of Example 9, wherein the halide comprises at least one of iodide, chloride, or bromide.

Example 11

The device of Example 9, wherein the pseudohalide comprises at least one of cyanate, isocyanate, fulminate, thiocyanate, isothiocyanate, or hypothiocyanite.

Example 12

The device of Example 1, wherein A' comprises a trivalent cation.

Example 13

The device of Example 1, wherein A' comprises at least one of an organic cation or an inorganic cation.

Example 14

The device of Example 13, wherein the organic cation comprises an alkyl ammonium cation.

Example 15

The device of Example 13, wherein the organic cation comprises at least one of methylammonium (MA), ethylammonium, propylammonium, butylammonium, formamidinium (FA), guanidinium (GA), dimethylammonium (DMA), or acetamidinium (AC).

Example 16

The device of Example 13, wherein the inorganic cation comprises at least one of cesium or rubidium.

Example 17

The device of Example 1, wherein B' comprises at least one of a monovalent cation or a multivalent cation.

Example 18

The device of Example 1, wherein B' comprises at least one of lead, tin, germanium, silver, bismuth, titanium, indium, gallium, copper, silver, gold, rhodium, or antimony

Example 19

The device of Example 1, wherein X' comprises at least one of a halide or a pseudohalide.

Example 20

The device of Example 19, wherein the halide comprises at least one of iodide, chloride, or bromide.

Example 21

The device of Example 19, wherein the pseudohalide comprises at least one of cyanate, isocyanate, fulminate, thiocyanate, isothiocyanate, or hypothiocyanite.

Example 22

The device of Example 1, wherein A and A' are the same.

Example 23

The device of Example 1, wherein A and A' are different.

Example 24

The device of Example 1, wherein B and B' are the same.

Example 25

The device of Example 1, wherein B and B' are different.

Example 26

The device of Example 1, wherein X and X' are the same.

Example 27

The device of Example 1, wherein X and X' are different.

Example 28

The device of Example 1, wherein the concentration gradient is measurable by time-of-flight secondary ion mass spectrometry.

Example 29

The device of Example 1, further comprising a hole transport layer (HTL), wherein the HTL is positioned adjacent to the perovskite layer.

Example 30

The device of Example 29, wherein the HTL comprises a metal oxide.

Example 31

The device of Example 30, wherein the metal oxide comprises at least one of nickel oxide, copper chromium iodide, or copper iodide.

Example 32

The device of Example 29, further comprising an electron transport layer (ETL), wherein the perovskite layer is positioned between the HTL and the ETL.

Example 33

The device of Example 32, wherein the ETL comprises a metal oxide.

Example 34

The device of Example 33, wherein the metal oxide comprises at least one of tungsten oxide, tin oxide, titanium oxide, or vanadium oxide.

Example 35

The device of Example 32, further comprising a first current collecting layer, wherein the ETL is positioned between the first current collecting layer and the perovskite layer.

Example 36

The device of Example 35, wherein the first current comprises at least one of an oxide or a metal.

Example 37

The device of Example 36, wherein the oxide is transparent.

Example 38

The device of Example 37, wherein the oxide comprises at least one of fluorine-doped tin oxide, indium-doped tin oxide, indium-doped zinc oxide, or aluminum-doped zinc oxide.

Example 39

The device of Example 36, wherein the metal comprises at least one of silver, gold, aluminum, or molybdenum.

Example 40

The device of Example 32, further comprising a second current collecting layer, wherein the HTL is positioned between the second current collecting layer and the perovskite layer.

Example 41

The device of Example 40, wherein the first current comprises at least one of an oxide or a metal.

Example 42

The device of Example 41, wherein the oxide is transparent.

Example 43

The device of Example 42, wherein the oxide comprises at least one of fluorine-doped tin oxide, indium-doped tin oxide, indium-doped zinc oxide, or aluminum-doped zinc oxide.

Example 44

The device of Example 41, wherein the metal comprises at least one of silver, gold, aluminum, or molybdenum.

Example 45

The device of Example 1, wherein the perovskite layer comprises at least one of $MAPbI_3$, $MAPbBr_3$, $CsPbI_3$, $CsPbBr_3$, MAFACsPbIBr.

Example 46

The device of Example 45, wherein the MAFACsPbIBr comprises about $Cs_{0.05}(MA_{0.17}FA_{0.83})_{0.95}Pb(I_{0.83}Br_{0.17})_3$.

Example 47

The device of Example 45, wherein the perovskite comprises $MAPb(I_xBr_{1-x})_3$, where $0 \leq x \leq 1$.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A method comprising:
providing a device comprising a first surface and a second surface;
depositing a first cation (A), a second cation (B), and an anion (X) onto at least one of the first surface or the second surface, resulting in at least one layer comprising at least one of A, B, or X; and
combining the first surface with the second surface such that the at least one layer is positioned between the first surface and the second surface, wherein:
during at least a portion of the combining, applying at least one of heat or pressure to at least one of the first surface or the second surface resulting in at least one of the heating of the layer or the pressurizing of the layer,
during the combining, substantially all of A, B, and X remain between the first surface and the second surface and the combining forms a temporary gas-tight seal between the first surface and the second surface and around A, B and X, the combining results in the transforming of the layer to a perovskite comprising $ABX_3$; and
the device is configured for the applying of the heat or the pressure.

2. The method of claim 1, wherein, during the combining, the heating of the layer is to a temperature between 0° C. and 500° C.

3. The method of claim 1, wherein, during the combining, the pressurizing of the layer is to a pressure between one atmosphere and 100 atmospheres.

4. The method of claim 1, wherein the combining is performed for a period of time between five seconds and 24 hours.

5. The method of claim 1, wherein the perovskite comprises at least one of $MAPbI_3$, $MAPbBr_3$, $CsPbI_3$, $CsPbBr_3$, $Cs_{0.05}(MA_{0.17}FA_{0.83})_{0.95}Pb(I_{0.83}Br_{0.17})_3$, or $MAPb(I_xBr_{1-x})_3$, where $0 \leq x \leq 1$.

6. The method of claim 1, wherein the device is a press.

7. The method of claim 1, wherein during the combining A, B, and X are encapsulated from an external environment.

8. The method of claim 1, wherein the first surface, the second surface, or both the first surface and second surface further comprise a release layer.

9. A method comprising:
providing a device comprising a first surface and a second surface;
a first depositing of at least one of a first cation (A), a second cation (B), or a first anion (X) onto the first surface, resulting in the forming of a first layer comprising at least one of A, B, or X;
a second depositing of at least one of a third cation (A'), a fourth cation (B'), and a second anion (X') onto the second surface, resulting in the forming of a second layer comprising at least one of A', B', or X'; and
combining the first surface with the second surface such that the first layer and the second layer are in physical contact with each other and the first layer and the second layer are positioned between the first surface and the second surface, wherein:
the device is configured to apply at least one of heat or pressure;
the combining forms a temporary gas-tight seal between the first surface and the second surface and around A, B, X, A', B' and X';
during at least a portion of the combining, applying the heat or pressure to at least one of the first surface or the second surface resulting in at least one of heating of the first layer and second layer or pressurizing of the first layer and the second layer,
during the combining, substantially all of A, B, and X remain between the first surface and the second surface,
during the combining, substantially all of A', B', and X' remain between the first surface and the second surface,
the combining results in the transforming of the first layer and the second layer to a layer of a perovskite comprising $A_{1-x}A'_xB_{1-y}B'_y(X_{1-z}X'_z)_3$, and $0 \leq x \leq 1$, $0 \leq y \leq 1$, and $0 \leq z \leq 1$.

10. The method of claim 9, wherein the perovskite layer has a concentration gradient across the thickness of layer of at least one of A, B, X, A', B', or X'.

11. The method of claim 9, wherein the device is a press.

12. The method of claim 9, wherein during the combining A, B, X, A', B' and X' are encapsulated from an external environment.

13. The method of claim 9, wherein the first surface, the second surface, or both the first surface and second surface further comprise a release layer.

* * * * *